US008183457B2

(12) United States Patent
Morgal

(10) Patent No.: US 8,183,457 B2
(45) Date of Patent: May 22, 2012

(54) METHOD AND APPARATUS FOR SOLAR ENERGY COLLECTION

(76) Inventor: Richard Alan Morgal, San Diego, CA (US)

( * ) Notice: Subject to any disclaimer, the term of this patent is extended or adjusted under 35 U.S.C. 154(b) by 2409 days.

(21) Appl. No.: 10/821,593

(22) Filed: Apr. 9, 2004

(65) Prior Publication Data

US 2004/0187907 A1  Sep. 30, 2004

Related U.S. Application Data

(63) Continuation-in-part of application No. PCT/US02/32550, filed on Oct. 11, 2002.

(60) Provisional application No. 60/328,767, filed on Oct. 11, 2001, provisional application No. 60/346,202, filed on Oct. 19, 2001, provisional application No. 60/343,663, filed on Oct. 26, 2001, provisional application No. 60/368,516, filed on Mar. 29, 2002, provisional application No. 60/368,567, filed on Mar. 29, 2002, provisional application No. 60/389,111, filed on Jun. 13, 2002, provisional application No. 60/409,873, filed on Sep. 10, 2002.

(51) Int. Cl.
*H01L 31/042* (2006.01)

(52) U.S. Cl. ....................................................... 136/246

(58) Field of Classification Search .................. 136/246
See application file for complete search history.

(56) References Cited

U.S. PATENT DOCUMENTS

| 4,069,812 A | 1/1978 | O'Neil | 136/246 |
|---|---|---|---|
| 4,114,596 A | 9/1978 | Chang et al. | 126/270 |
| 4,139,286 A * | 2/1979 | Hein et al. | 353/3 |
| 4,148,301 A | 4/1979 | Cluff | 126/271 |
| 4,166,917 A | 9/1979 | Dorfeld et al. | 136/259 |
| 4,204,881 A | 5/1980 | McGrew | 136/89 |
| 4,235,221 A | 11/1980 | Murphy | 126/415 |
| 4,238,246 A | 12/1980 | Genequand et al. | 136/248 |
| 4,289,112 A | 9/1981 | Roseen | 126/415 |

(Continued)

FOREIGN PATENT DOCUMENTS

AU    723 841 B    9/2000

(Continued)

OTHER PUBLICATIONS

"Das solar marine-Kraftwerk" by Laing, N., *Eurosolar* (magazine) Feb. 1992 pp. 18-19.

(Continued)

*Primary Examiner* — Alexa Neckel
*Assistant Examiner* — Shannon Gardner
(74) *Attorney, Agent, or Firm* — Boling Patents; William Boling

(57) ABSTRACT

A pontoon structure is described that may be floated on a body of coolant liquid, together with others in an array. The entire array may be aligned with the sun in an azimuth direction, and each pontoon may be rotated to align it with the sun elevation. A solar energy conversion target, typically a photovoltaic conversion device, may be mounted on a portion of the pontoon structure that remains below the coolant level over a wide range of sun elevations. An asymmetric focus lens may be used to direct light entering the pontoon toward the conversion target. A lens to improve the uniformity of light directed to a conversion target is also described that is useful with pontoons, and can be configured to improve target illumination uniformity, particularly in the presence of partial shadowing, by directing light uniformly toward the target from each of a plurality of subregions.

14 Claims, 16 Drawing Sheets

U.S. PATENT DOCUMENTS

| | | | |
|---|---|---|---|
| 4,312,330 A | 1/1982 | Holdridge | 126/440 |
| 4,315,500 A | 2/1982 | Gonder | 126/425 |
| 4,360,004 A | 11/1982 | Testolini | 126/415 |
| 4,361,717 A | 11/1982 | Gilmore et al. | 136/246 |
| 4,496,787 A | 1/1985 | Touchais et al. | 136/248 |
| 4,717,821 A | 1/1988 | Messiou | 250/221 |
| 4,771,764 A | 9/1988 | Cluff | 126/440 |
| 4,786,795 A | 11/1988 | Kurashima et al. | 250/203.4 |
| 4,848,319 A | 7/1989 | Appeldorn | 126/440 |
| 5,286,305 A | 2/1994 | Laing et al. | 136/246 |
| 5,442,178 A | 8/1995 | Baldwin | 250/353 |
| 5,445,177 A * | 8/1995 | Laing et al. | 136/246 |
| 5,665,174 A | 9/1997 | Laing et al. | 136/246 |
| 5,772,791 A | 6/1998 | Laing | 136/246 |
| 5,877,499 A | 3/1999 | Baldwin | 250/353 |
| 6,020,553 A | 2/2000 | Yogev | 136/246 |
| 6,031,179 A | 2/2000 | O'Neil | 136/246 |
| 6,051,776 A | 4/2000 | Kimata et al. | 136/246 |
| 6,075,200 A | 6/2000 | O'Neil | 136/246 |
| 6,220,241 B1 | 4/2001 | Yeomans | 126/565 |
| 6,225,551 B1 | 5/2001 | Lewandowski et al. | 136/246 |

FOREIGN PATENT DOCUMENTS

| | | |
|---|---|---|
| DE | 101 50 176 A1 | 10/2001 |
| WO | WO 03/032404 | 4/2003 |
| WO | WO 2003/034506 A2 | 4/2003 |

OTHER PUBLICATIONS

Written Opinion Re: PCT/US02/32550 issued Aug. 22, 2003; 4 pages.

Reply to Written Opinion Re: PCT/US02/32550 mailed Nov. 22, 2003; 8 pages.

International Preliminary Examination Report Re: PCT/US02/32550, issued Nov. 13, 2003; 3 pages.

* cited by examiner

METHOD AND APPARATUS FOR SOLAR ENERGY COLLECTION

This application is a continuation-in-part of co-pending international patent application number PCT/US02/32550, filed Oct. 11, 2002, entitled "Method And Apparatus for Solar Energy Collection," published in the English language on Apr. 17, 2003 as WO 03/032404 A1, the contents of which are hereby incorporated in their entirety by reference, which application in turn claims priority under 35 USC 119 to each of the following U.S. provisional patent applications, the contents of which are hereby incorporated by reference in their entirety: application No. 60/328,767, filed Oct. 11, 2001 and entitled "Tubular Tracking;" application No. 60/346,202, filed Oct. 19, 2001 and entitled "Tubular Tracking;" application No. 60/343,663, filed Oct. 26, 2001 and entitled "Tubular Tracking;" application No. 60/368,516, filed Mar. 29, 2002 and entitled: "Tubular Tracking Wind and Wave Immune Feature;" application No. 60/368,567, filed Mar. 29, 2002 and entitled "Tubular Tracking Shade Tolerant Fresnel Lens Design;" application No. 60/389,111, filed Jun. 13, 2002 and entitled "Optical Solar Tracking System;" and application No. 60/409,873, filed Sep. 10, 2002 and entitled "Method and Apparatus for Solar Energy Collection."

BACKGROUND OF THE INVENTION

1. Field of the Invention

This invention relates to the field of solar energy, and more specifically to systems for collecting, concentrating and converting solar energy to a more readily distributed form of energy.

2. Related Art

Efficient collection of solar energy entails capturing as much of the incident sunlight striking a given site space, ensuring a minimum amount of land is consumed for energy generation purposes. The high cost of conventional solar collectors and their intolerance to being shadowed has led tracking solar power plant designers to typically distribute solar collectors with a site utilization collection efficiency of less than 50 percent. Two axis-tracking photovoltaic systems typically deliver more energy per solar collector than fixed photovoltaic systems but require more land, with less than 25 percent site utilization collection efficiency being typical.

Concentration of the sun's rays can significantly reduce the amount of energy conversion material required to create a given amount of power. Using concentration lenses reduces the expensive energy conversion device's size and relative cost. When solar concentration is utilized, tracking the sun's position in the sky is typically required to deliver the sun's concentrated energy accurately to a smaller target. Single axis tracking systems are known in which the sun is tracked only around the azimuth axis, but in such systems a positional variation of the focal point with various sun heights typically causes significant inefficiencies in solar concentration. On the other hand, the electromechanical systems required to accurately track the sun's position and hold the collector in position for two-axis tracking systems have historically consumed gains that might be realized by using concentrated sunlight and smaller energy conversion devices. Thus, there is a need for cost-effective solutions to tracking and concentrating sunlight onto relatively small conversion devices.

Converting concentrated sunlight into electricity typically results in substantial waste heat. Therefore, there is need for an efficient thermal management process that provides a reliable method of removing such waste heat from the energy conversion device. Most approaches to solving this problem require an active pumping process and distribution system that involves water moving though tubes and hoses, requiring the system to be failure-free in order to ensure survival of the energy conversion device in the harsh concentrated sunlight. A single failure of the cooling system is likely to irreparably damage the costly energy conversion devices.

SUMMARY OF THE INVENTION

The invention is a solar energy collection system and method that provides a combination of features to improve upon the present state of the art, enhancing efficiency in the use of land for solar collection, and permitting more effective use of high efficiency photovoltaic cells.

One embodiment includes a solar converter apparatus that has a support structure, such as a pontoon, for floating on a liquid bath connected to a guidance frame for azimuth alignment, and includes at least one photovoltaic conversion device mounted within the support structure. The support structure is rotatable about an axis for elevation alignment, and a lens is provided for guiding aligned incoming light toward the conversion device, which is smaller than the lens. The conversion device may be mounted on the support structure such that it is below the level of the liquid bath across a wide operating elevation rotation range. The lens may bend incoming light asymmetrically, and the converter apparatus may be configured to provide uniform light distribution to operating photovoltaic devices in spite of partial shadowing of the lens.

A lens that may be used to provide uniform light distribution to operating photovoltaic devices in spite of partial shadowing includes subregions that each, individually, distribute their light uniformly over a solar energy conversion target.

DETAILED DESCRIPTION

Introduction

Figure 1:
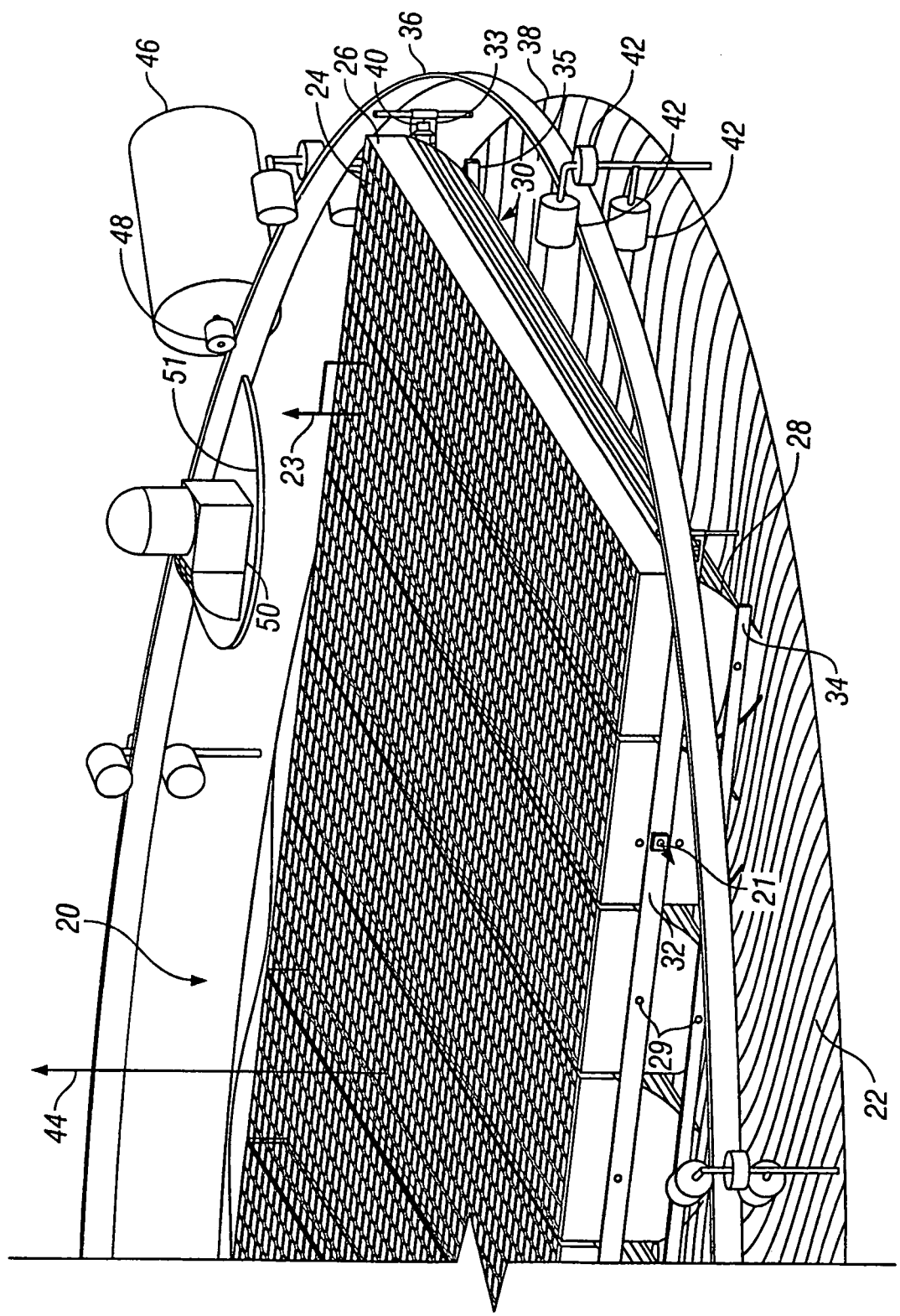
FIG. 1 is a perspective view of a pontoon solar collector array on a coolant pool.

The solar collection method and apparatus described herein addresses a number of the needs evident in the prior art, permitting improvements in collection efficiency. The method and apparatus are illustrated by detailed examples in which the collectors are shown as being essentially elongated pontoons, surfaced with concentrating lensing and typically floated in an array on a liquid pond, with the array rotated as a unit to align toward a light source azimuth. Each collection pontoon rotates about its own axis for alignment with the light source elevation. The illustrated embodiments encompass only a few of the many forms that the invention, as defined exclusively by the attached claims, may take.

The illustrated pontoon solar collector is constructed to float on a cooling pond (typically water) and to track the sun in azimuth and elevation. Compared to earlier systems, they may be spaced more closely to increase land utilization, and also have features to permit high levels of light concentration, which allows using a smaller amount of higher-efficiency solar conversion devices. The principles that permit these enhancements in efficiency may be used with many other types of solar converters to good effect.

A roof lens is provided on the upper surface of the pontoon solar collector, and may cover substantially the entire upper surface. The pontoon solar collector roof lens concentrates the incident sunlight toward the conversion device. It may guide the light directly onto the conversion device, or indirectly if the light is further refracted or reflected before reaching the conversion device. The roof lens as a whole may be flat, as is illustrated for simplicity, or may be curved in a convex, concave or more complex pattern, such as corrugation, to facilitate tolerance to washing and rain, or to promote mechanical stability. Curved lenses are not illustrated, because although incorporation of curvature is within the skill of a good lens designer, the additional complication might obscure the concepts of concentration, uniform dispersal over a target region, and shadow tolerance that are set forth herein.

The pontoons rotate to track sun elevation, and if close together, as is desirable for efficient land utilization, will shadow each other at some elevations. Shadowing could cause irregular illumination of a target photovoltaic converter, resulting in substantial decrease in conversion efficiency. Solutions are described that ensure that the target is reasonably uniformly illuminated, even when a lens is partially shadowed, thus providing shadow tolerance. In one such solution, the roof lens may utilize a tiled lens design in which each tile is a subregion of the roof lens, and each tile delivers the light that passes through it uniformly over the surface of the target. Accordingly, because each particular tile contributes only a certain small proportion of the light to the target, uneven illumination of the particular tile will cause uneven shading of the target only to the same small proportion. That is, other tiles that are fully, or at least differently shaded, will dominate the light distribution to the target. Many ways to effect shadow tolerance with lenses are described below, as well as other techniques for providing shadow tolerance. Such shadow tolerance allows the pontoon solar collectors to be placed closely, substantially abutting, without causing uneven target illumination that would substantially impair conversion efficiency. Thus, shadow tolerance facilitates efficient sunlight collection over substantially all of the land area covered by the pontoon array.

The conversion device, typically a photovoltaic cell, is not 100% efficient in converting incoming light to an intended form for transportation to an end user, and a significant portion of the energy is typically converted to heat that raises the temperature of the photovoltaic cell. Particularly for conversion devices that operate best with highly concentrated sunlight but at low temperatures, heat removal is needed for maximum efficiency, or even for survival of the conversion device.

Active cooling may be used in some embodiments, but passive cooling may eliminate some complexities, and reduce the likelihood of catastrophic failures due to failure of active cooling systems. Mounting the conversion devices in close thermal contact with the cooling liquid bath may facilitate passive cooling. Effective passive cooling may be obtained by mounting the conversion devices on a portion of the pontoon that is actually submerged in the cooling liquid bath, even as the pontoon is rotated over a wide range of elevation angles.

In order to keep the conversion device mounting closely thermally coupled to the cooling bath, for example mounted on a region that remains submerged below the coolant level, the lens may be designed with an asymmetric focus. Light that enters a lens along an incoming light axis will exit the lens at an exit angle from the incoming light axis. For most lenses, the exit angle, averaged for uniform light over the lens surface, will not deviate much from the incoming light axis. For an asymmetric focus lens, however, the average exit angle is substantially different than the incoming light angle. By using an asymmetric focus lens, the geometry of the pontoon can be optimized to permit the conversion device mounting sites to be positioned better. For example, the sites may remain below the coolant surface level over the entire elevation operating range of the pontoon.

A tracking system is used to ensure that the concentrated sunlight hits the targeted energy conversion device. In one of many solutions for tracking, an optical solar tracking system may be directly attached to the pontoon solar collector, providing immediate optical feedback of orientation changes made by the tracking system's actuators. It will typically be convenient to have an azimuth drive system that is external to the individual pontoons to align a pontoon, or an array of pontoons, to the correct orientation with respect the sun's azimuth. However, a drive system to rotate the pontoon(s) to achieve elevation alignment may be located primarily on each individual pontoon, or may be located externally and coupled so as to align a number of pontoons (such as all of the pontoons in an array). Whether the drive impeller is on the pontoon or not, the angle sensors may be either on or off the pontoon, with advantages accruing to both methods.

The weight of the floating pontoons is carried by the pond liquid, typically water with a coating of oil to reduce evaporation, which allows for supported tracking in both azimuth and elevation, reducing the mechanical requirements of the tracking actuation system. Additionally, the low profile of floating pontoons positioned immediately adjacent to one another provides minimal wind loading, further reducing the mechanical requirements of the tracking actuation system.

Employing combinations of the features described herein may permit reduction in costly photovoltaic cell surface area, a significant reduction in mechanical tracking infrastructure, and/or a significant reduction in plant site area. Thus, combinations of these features should substantially reduce the cost of solar power plant implementation.

Pontoon Solar Collectors on Water and Azimuth Tracking Motion

Referring to FIG. 1, pontoon solar collector array 20 floats on a pond surface 22. Each pontoon solar collector 30 has a light refracting roof lens 24 that is attached to the top of the pontoon body 26 and to two end caps 28, one on each end of the body 26. Both end caps 28 and roof lens 24 are typically sealed to the body 26 to prevent water from seeping inside the pontoon solar collector 30. Each end cap 28 provides attachment points 29 to a spacing rod 32 or 33 and, at least in embodiments in which rotational control is shared between different pontoons, to a control rod 34 or 35, to permit or provide rotation about a rotation axis defined between the spacing rod attachment points.

Both ends of each spacing rod 32, 33 are typically connected to a perimeter ring 36 that encircles the pond 38. The attachment between the perimeter ring 36 and spacing rods 32, 33 may be a vertically sliding, mechanical fastener 40, allowing the water level 22 of the pond 38 to vary within limits and still enable the pontoon solar collector array 20 to track the sun. The perimeter ring 36 may be held in position by wheels and/or pulleys 42 in a manner that would allow the perimeter ring 36 to rotate freely around its center vertical axis 44.

Rotation around the center axis 44 of the perimeter ring 36 may be effected by any appropriate means, such as a fixed azimuth actuation motor 46, connected to the perimeter ring 36 through a drive wheel or gear 48, so long as azimuth positional adjustment is provided to track the sun. Tracking both azimuth and elevation permits alignment of an incoming light axis of each pontoon with the sun as it moves throughout each day and season. The pontoon solar collector array 20 is correctly tracking the azimuth of the sun when the rotational axes of the pontoon collectors 21 are perpendicular to the sun's azimuth. (Note that in other embodiments, the angle between the pontoon collector's rotational axis and the incoming light axis—the sun—need not be 90 degrees if the optical path is adjusted to correspond to such a non-perpendicular angle between rotational axes and sun azimuth.)

An optical solar azimuth tracking system 50 may be attached to the perimeter ring 36 to locate the sun's azimuth position in the sky relative to the pontoon solar collector array 20. The tracking system may provide electrical control signals to a fixed azimuth actuation motor 46, which in response moves the perimeter ring 36 and pontoon solar collector array 20 to track the sun azimuth. Electrical wiring, carrying the power generated within the pontoon solar collectors 30, and sometimes carrying control signals, may be routed to the center axis region of the perimeter ring 36 via the spacing rods 32, 33 and directed downward to the bottom of the pond, below the operational region of the pontoon solar collector array 20. Once below the array 20, the cables may be directed to an edge of the pond 38, and brought above the surface for access to the grid and control of the azimuth actuation motor 46.

In an alternative embodiment, a perimeter ring may be directly attached to spacing rods, which are connected to the end caps of each pontoon solar collector in an array. The perimeter ring and spacing rods may be held above the water's surface by the buoyant force of the pontoon solar collector array. A floating azimuth actuator's output shaft, connected to a sprocket, may be engaged with a chain that encircles the perimeter ring. The perimeter ring may be given a "C" profile to hold the chain captive within the perimeter ring. Cylindrical wheels may be used to keep the perimeter ring in position. Such a configuration may be implemented to cover large water bodies with floating azimuth actuation motors and cylindrical positioning wheels, being held in position by tensioned cables running in a grid-like pattern anchored to the shore. Unwanted wave activity from larger bodies of water may be subdued with appropriate wave suppression barriers. A pontoon-supported perimeter ring, or equivalent, may even operate without a firm connection to ground, adjusting azimuth by means of "paddling" as necessary, so that collectors can be almost entirely unmoored (except for connection to an output energy product storage device).

System for Wind and Wave Immunity

Figure 2:
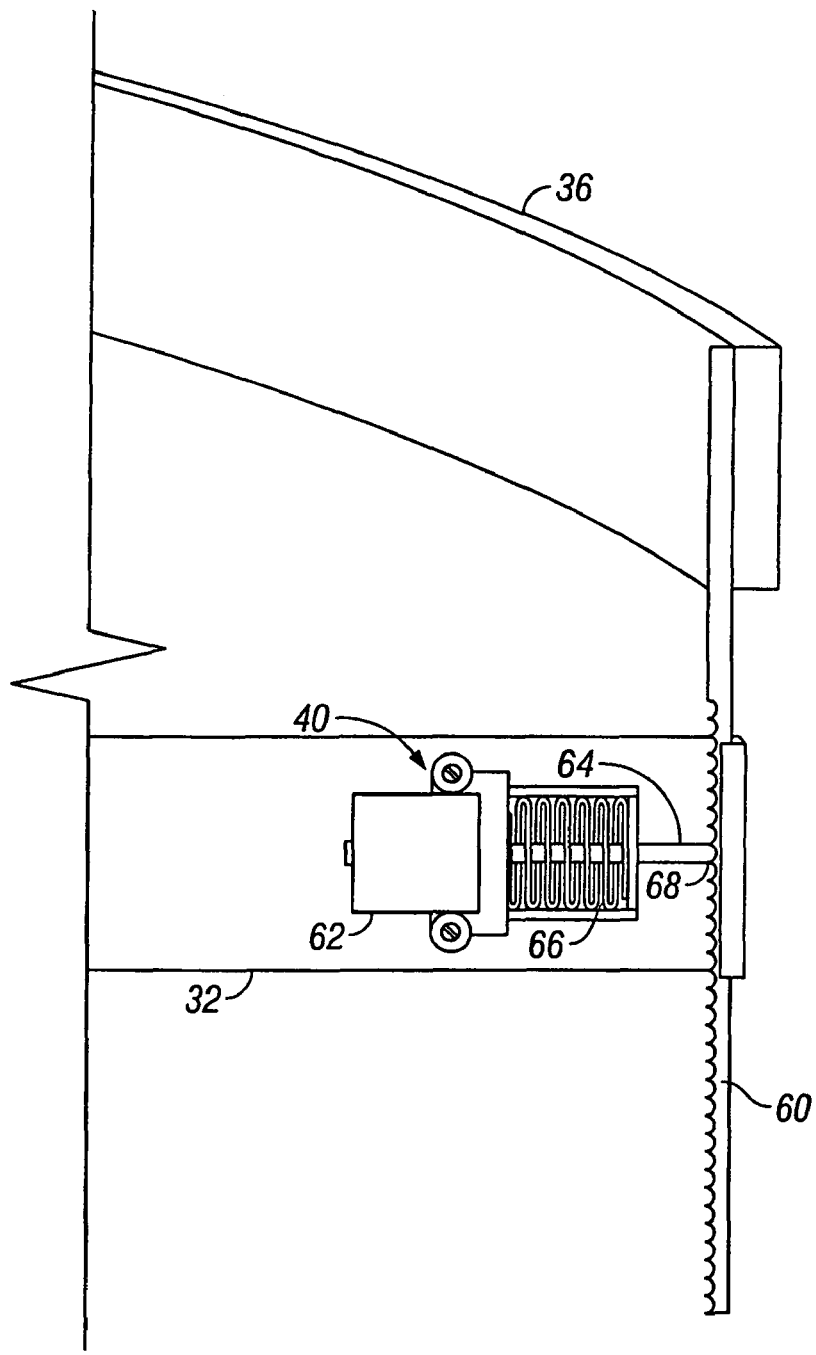
FIG. 2 shows a spacing rod attachment to a perimeter ring for varying liquid levels.

FIG. 2 shows one method of attaching the ends of the spacing rod 32 to the perimeter ring 36 using a mechanical fastener 40, providing stability to the pontoon solar collector array during windy or wavy conditions and allowing for a water level variation in the pond. The end of the spacing rod 32 may wrap around a notched slider bar 60, which is attached to the perimeter ring 36. An electromechanical solenoid 62 contains a pin 64 that is spring loaded by a spring 66 to force the pin 64 into a notch 68 in the notched slider bar 60. When the electromechanical solenoid 62 is activated, it overpowers the spring 66 and pulls the pin 64 out of the notch 68 in the notched slider bar 60. The end of the spacing rod 32 can now move up or down along the notched slider bar 60, allowing the spacing rod 32 to find its natural floatation level on the variable water level of the pond.

Once a floating equilibrium level is attained, the electromechanical solenoid 62 may be deactivated, enabling the spring 66 to force the pin 64 into a notched location, locking the spacer rod 32 to the slider bar 60. By mechanically attaching the perimeter ring 36 to the spacing rods 32, the stability of the entire tracking system can be used to stabilize each pontoon solar collector array from wind and wave action. The pontoon solar collector array may also adjust its floatation level when the weather is calm, or whenever a dramatic water level change occurs within the pond. Daily changes due to evaporation will typically be small enough that the adjustment need not be performed more than once per day. Water loss due to evaporation may be reduced by adding a small amount of oil to the pond, or by other barriers, such as small buoyant balls (or other self-distributing barrier sections) that cover much, or all, of the pond surface.

Elevation Motion and Thermal Management

Figure 3:
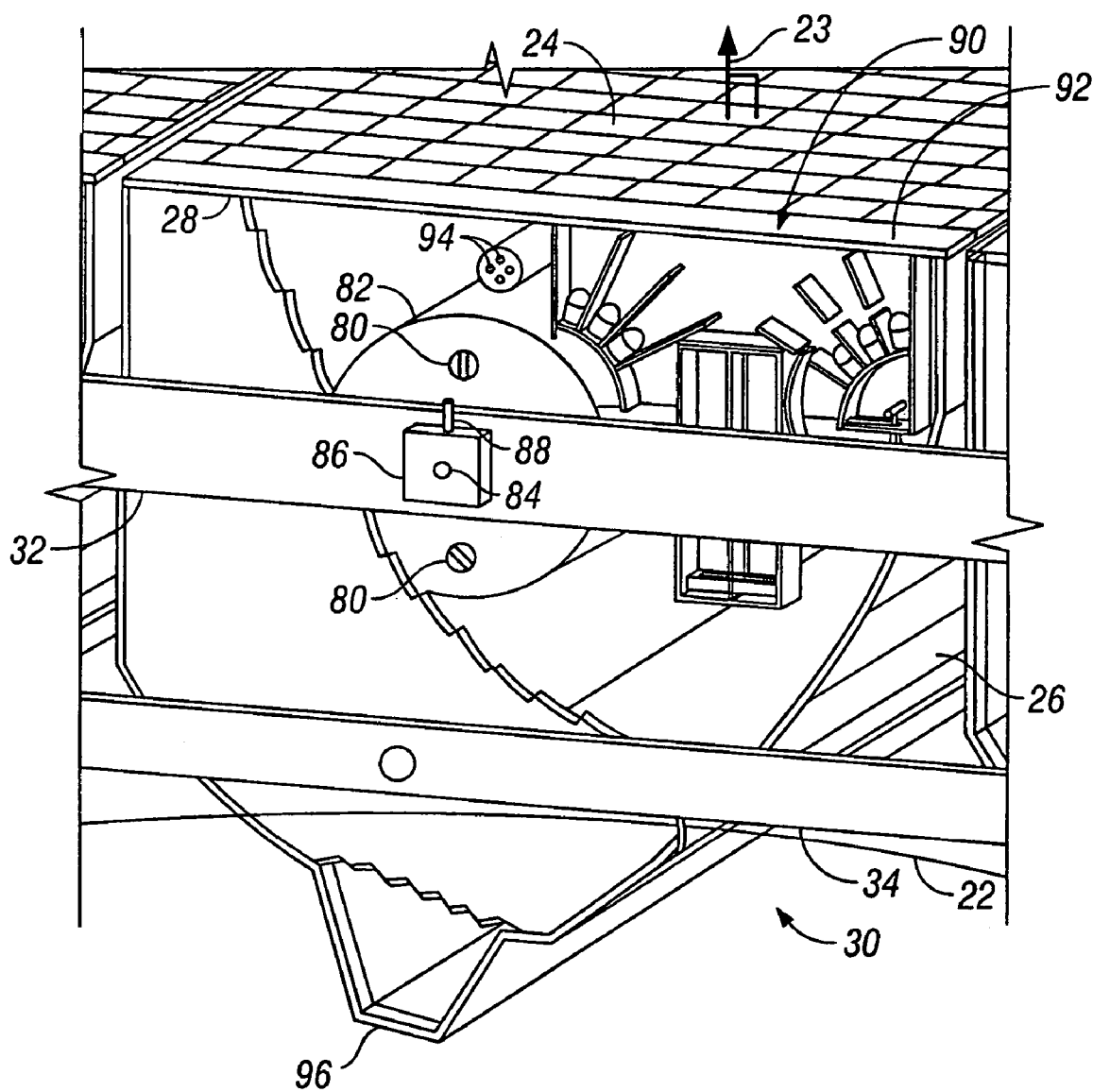
FIG. 3 is a perspective view of an end of a pontoon collector with a motor/gearbox rotational actuator and solar optical tracking system components.

FIG. 3 shows the end of a pontoon solar collector 30. Attached to the inside face of the end cap 28 by two screws 80 is the case of a motor/gear box 82 having an output shaft 84 protruding through the end cap 28 and through a hole in the spacing rod 32. A block 86 is mounted to the spacing rod 32, with a hole positioned to accept the motor/gear box output shaft 84. A smaller hole in the block 86 enables a pin 88 to be inserted into the block 86 and also through a hole in the motor/gearbox output shaft 84, fixing the motor/gearbox output shaft 84 to the block 86, and to spacing rod 32. The gearbox function contained within the motor/gearbox 82 is used to reduce the speed of the electric motor's output, and may also provide a mechanical brake function to hold the pontoon solar collector 30 in position when there is no power applied to the motor.

A small relief 92 in the refraction pattern of the roof lens 24 may be provided to allow light to pass into an area of an optical solar elevation tracking system 90 without refraction. Power for the optical solar elevation tracking system 90, and motor/gearbox 82, may be provided from the power generated by the photovoltaic cells within the pontoon solar collector 30, or by a potential between the electrical connectors 94, passing through the end cap 28, or in any other appropriate manner. The lowest surface of the pontoon solar collector 30 provides a mounting surface for the photovoltaic cells, and may serve as a heat exchange element 96 between the photovoltaic cell and the large thermal mass of the pond.

When the pontoon solar collector 30 is azimuth-aligned with the sun, the pontoon solar collectors are rotated as necessary about their rotation axes (generally parallel to a longitudinal axis of the pontoon) to track the sun in elevation. Correct tracking is established when the incoming light axis for which the roof lenses 24 are designed, which is typically but not necessarily a normal vector 23 of a roof lens, is aligned to the sun elevation for each pontoon.

The motor/gearbox(s) 82 may be controlled by the optical solar elevation tracking system 90, which is shown mechanically attached to an end cap 28 inside the pontoon collector and electrically wired to the motor gearboxes 82. The optical solar elevation tracking system 90 may be used to determine sun elevation and create an electrical drive signal when alignment error is sensed. In one embodiment, proportional control signals are sent to the motor/gearbox. The output shaft of the motor/gearbox 82 is held stationary to the spacing rod 32 by the pin 88 in the block 86, so that when energized the motor/gearbox case 82 rotates around its stationary output shaft 84. The pontoon solar collector 30 is firmly coupled to the motor/gearbox case 82 and thus also rotates, changing elevation angle.

Pontoon solar collectors may also contain two motors, with one motor/gearbox mounted to each end cap and with their output shafts attached to their corresponding spacing rods. Motor/gearboxes contained in the same pontoon solar collector may be wired in parallel, enabling them to work together to keep the pontoon collector's elevation motion uniform and also providing equal weight on each side of the pontoon, keeping the array level on the surface of the pond. (Alternatively, motor/gearboxes and elevation tracking sensors may be placed in alternating ends of adjacent pontoon collectors.) The rotational movement caused by activating the motor/gearbox pair, described above, may also be mechanically translated to other pontoon collectors in the array, via control rods attached to each end cap, so that one motor/gearbox may cause, or assist with, rotation of several pontoons.

Conversion of concentrated sunlight into electricity requires management of solar energy that is absorbed by the cell, but is not converted to a form such as electricity that is readily transmitted away. The small thermal mass of the photovoltaic cell will rapidly rise in temperature when subjected to intense concentrated solar radiation unless the heat is removed. Bonding the photovoltaic cell to an intermediate heat transfer material using a thermally conductive adhesive is a conventional method of removing unwanted heat from photovoltaic cells. Once the heat is transferred to the intermediate heat transfer material, a coolant is typically circulated to remove the heat from the intermediate heat transfer material. The photovoltaic cell heat exchange element 96 should have heat-conductive properties that enable it to absorb heat from the illuminated photovoltaic cell through a thermally conductive adhesive and pass the heat readily into the large thermal sink, such as the pond. In some embodiments, natural convection moves the coolant liquid in the pond and provides cooler coolant to the pontoon outside from the cell attachment. Such natural convection helps refresh the coolant contacting the thermal heat sink without a need for pumps, fittings or hoses, delivering a low cost, reliable method of cooling the cells. Active approaches may be used in some embodiments, such as active stirring of the pond liquid, to enhance cooling.

In one alternative embodiment, each pontoon collector 30 may contain its own optical solar elevation tracking system 90 and motor/gearboxes 82, eliminating the need for control rods 34. Without using control rods, it is also possible to actuate the elevation movement of each pontoon solar collector using a single optical solar elevation tracking system and a single motor/gearbox. A counter weight may be attached to the end cap, opposite the motor/gearbox assembly, to balance the weight across the pontoon solar collector.

Another embodiment may include one motor/gearbox in each pontoon without a counter weight attached to the opposite end cap of the pontoon. The end cap that holds such motor/gearboxes may be alternated for adjacent pontoons in order to balance weights. The spacing rod may be used to distribute the weight of alternating end caps (with and without motor/gearboxes) over the entire array. This approach requires few or no counter weights, and only one motor/gearboxes per pontoon, in exchange for having two versions of the pontoon collector. One version of the pontoon solar collector would have its east end cap holding the motor/gearbox, the other pontoon solar collector version would have its west end cap holding the motor/gearbox.

Disposing the elevation rotational axis 102 (see FIG. 4) of the pontoon solar collector 30 away from the center of gravity or force may create a biasing torque load on the motor/gear box to reduce or avoid gear backlash.

The braking function of the gearbox can also be performed by other means, such as a spring loaded/electrically deactivated brake or some other means that may hold the pontoon's position in place without consuming electrical power. Arrays with large numbers of pontoon solar collectors may require more that one motor/gearbox pair to actuate the pontoons. Additional mechanical drive capacity, such as for large pontoon solar collector arrays that distribute rotational motion to the motorized pontoons by means of control rods, may be attained by mounting multiple motor/gearbox pairs into multiple pontoons collectors. All motors may be electrically wired in parallel to perform the task of elevation rotation actuation.

The each pontoon solar collector may have a single piece body 26 (preferably extrudable), or it may be comprised of a plurality of pieces. In the latter case, a simpler and smaller u-shaped base (typically easily extruded) may be used as an assembly enclosure for the fragile photovoltaic cells and the wiring required for photovoltaic cell interconnect. Such a base may be used to allow the cells to be mounted and wiring assembled in one facility, then shipped as a subassembly to a final assembly site at which sides, end caps, and roof lens of the pontoon solar collector may be adhered to the body base at a location near the application site, reducing the bulk and cost of shipping fully assembled pontoon solar collectors to the field. Most pieces of the pontoon can readily be designed to be extrudable.

Basic Pontoon Operation

Figure 4:
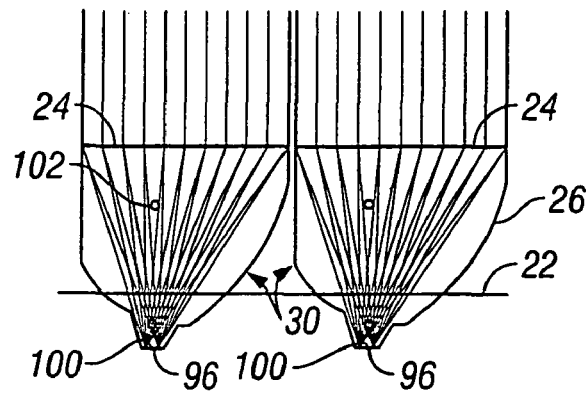
FIG. 4 is a cross sectional view of adjacent pontoon solar collectors aligned for collection from 90 degrees elevation.

In FIG. 4, rays from directly overhead are refracted when passing through the roof lens 24 of the pontoon solar collectors 30 and are concentrated at target photovoltaic cells 100 for electric generation. Positioning the cell 100 far away from the roof lens 24 reduces optical light losses associated with extreme light bending near edges of the roof lens 24. Additionally, disposing cell 100 as far as possible from the roof lens 24 minimizes cosine losses associated with light striking the photovoltaic cell at a significant angle.

The shape of the pontoon body 26 pontoon solar collectors 30 to be closely packed, essentially abutting, without interfering with one another during elevation tracking rotation. Closer packing permits a higher percentage of actual collection area to derive more benefit from the tracking hardware and the surface area of the pond. Close packing is facilitated by the shapes of the sides of the pontoon body 26, coming straight down or slightly tapering inward toward the target photovoltaic cell 100. With pontoons abutting, almost all of the light incident on the array area traverses a roof lens to be guided to a solar conversion target (with the exception, in some embodiments, of pontoon wall thickness). The pontoon body profile shown gives a large cross sectional area for the pontoon solar collector 30, resulting in a pontoon solar collector with correspondingly large volume and resultant floatation, keeping the lower portion of the roof lenses 24 above the pond's surface 22 even at low sun elevations. Alternative pontoon body profiles may be used to provide different floating dynamics or low sun height operational ranges.

Figure 5:
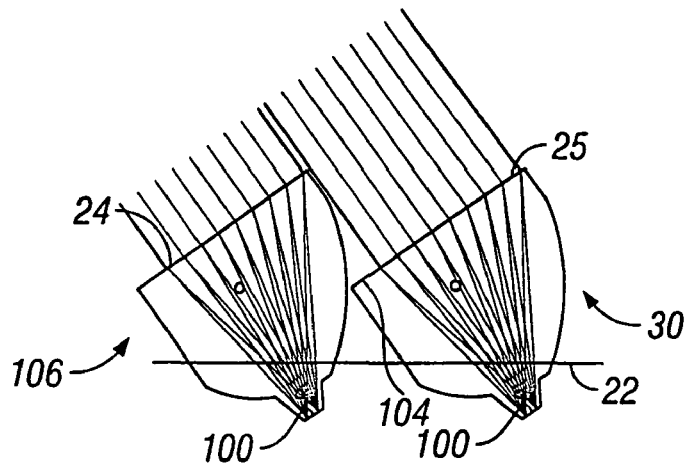
FIG. 5 is a cross sectional view of adjacent pontoon solar collectors aligned for collection from 55 degrees elevation.

As shown in FIG. 5, the pontoon solar collectors 30, 106 are rotated to capture the rays of sunlight coming from 55 degrees elevation above the horizon. The pontoon solar collectors 30, 106 are effectively receiving all the light from the sun with the roof lenses 24, 25 that deliver the light to the photovoltaic cells 100. A portion 104 of the roof lens 25 is shaded by the neighboring pontoon 106. The roof lenses 24, 25 may be designed to distribute the light passing through the partially shaded roof lens 25 uniformly over the surface of the photovoltaic cell 100, typically concentrated by the ratio of the receiving area of the roof lens to the target area of the cell 100. Such design, further described below, reduces or eliminates the performance degradation usually associated with photovoltaic solar collector partial shading, which occurs when tracking solar collectors in an array are placed immediately adjacent to one another. The roof lens design is one way of providing shadow-tolerance to a pontoon solar collector 30. Shadow-tolerance allows pontoon solar collector 30 to be placed immediately adjacent to neighboring collector 106 without experiencing significant shadow-induced conversion inefficiencies, reducing site space requirements to generate a given amount of power.

Figure 6:
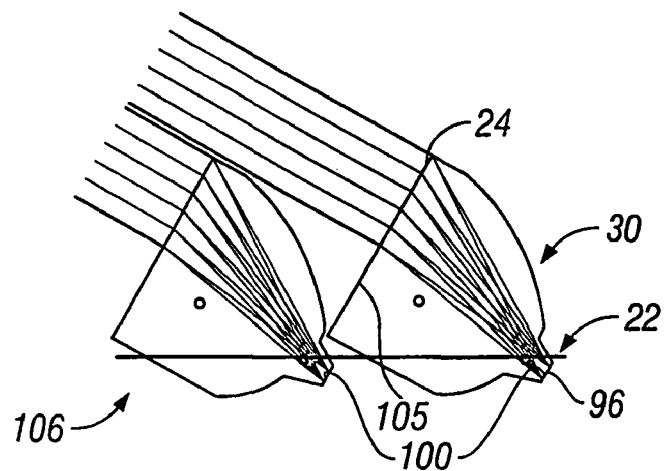
FIG. 6 is a cross sectional view of adjacent pontoon solar collectors aligned for collection from 30 degrees elevation.

Referring to FIG. 6, the pontoon solar collectors 30, 106 are shown rotated to capture the rays of sunlight coming from 30 degrees above the horizon. One half of the roof lens 24 surface area 105 is effectively blocked by the neighboring pontoon solar collector 106, yet all the incident light is being directed to a targeted photovoltaic cell 100. The offset tile Fresnel lens design of the roof lens 24 enables the sunlight that passes through the partially illuminated roof lens 24 to be evenly distributed on the surface of the targeted photovoltaic cell 100 ensuring efficient conversion of the concentrated light into energy.

Heat derived from the concentrated sunlight could quickly damage the photovoltaic cell 100 or significantly reduce its efficiency if not managed properly. The photovoltaic cell 100 is attached to a thermally conductive heat exchange element 96 of the pontoon solar collector 30 in a method that enables the heat absorbed by the cell 100 to be transferred into the heat exchange element 96 of the pontoon solar collector 30, where the heat can then dissipate into the surrounding pond water 22. The narrow protrusion region where the photovoltaic cell 100 is mounted provides enough space for heat exchange element 96, while providing an unobstructed path for the concentrated sunlight to pass to the cell 100 from all parts of the roof lens. The protruding portion of the pontoon solar collector cross section also helps keep the heat exchange element 96 well below the surface of the pond 22 when the pontoon solar collector is tracking the sun at low elevations, assuring that convective thermal currents of the pond's coolant are not interrupted by the photovoltaic cell's heat exchange element 96 being too close to the pond's surface.

Note that the pond will not always be perfectly flat, and the "level" of the pond, with respect to the cell 100 or mounting/heat exchange element 96, may be defined as the average level. The cell 100, and/or thermal mounting heat exchange element 96, is "below" the level of the pond over a sun elevation range from 90 degrees, as shown in FIG. 4, down to an angle of less than 30 degrees elevation (or, more than 60 degrees from vertical), as shown in FIG. 6, since the pond level 22 indicates an average pond level.

The focal point/line position of the roof lenses 24 may be made asymmetric to facilitate locating the photovoltaic cell 100 on a mounting region that remains in thermal contact with the pond cooling water 22 during low sun heights. "Asymmetric" focus is used to mean that the average exit angle of light that uniformly enters the lens face parallel to the incoming light axis (for which it is designed), as compared to the incoming light angle, is significantly non-zero. As shown (FIG. 4), the asymmetry angle between the incoming and average exiting angles is approximately 9 degrees; the asymmetry angle will vary, of course, depending upon the exact geometry of the pontoon. The photovoltaic cell 100 remains below the pond's surface 22, providing passive cooling, for all operational sun heights.

Shadowing Effect Illustration

Shadow tolerance, as described above, reduces the deleterious effects of partial shading of a solar collection region by providing relatively uniform light distribution to the photovoltaic collection area even in the presence of partial shadowing. The uniform and expected nature of the shadowing that occurs on closely spaced pontoon solar collector roof lenses provides special opportunities for effecting shadow tolerance.

Figure 7:
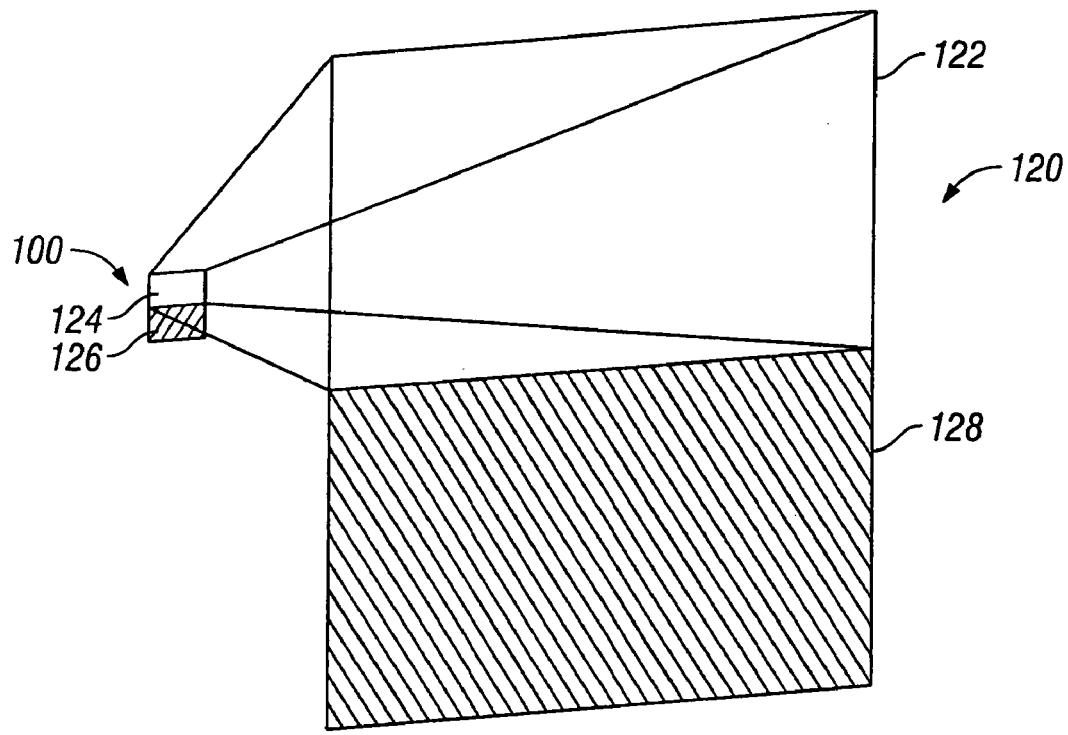
FIG. 7 is a perspective view of a partially shaded conventional lens and target.

FIG. 7 illustrates a problem with using a conventional, single focal point lens 120 for a solar collector subject to partial shading. Shadowed region 128 of the conventional lens 120 is as expected for a pontoon solar collector operating at 30 degree elevation, which corresponds to 50% shading of roof lens 120. The conventional lens maps the shaded region 128 onto the target 100 as dark region 126. The unobstructed portion of the lens 122 focuses its light on the upper half 124 of the target 100. Such uneven illumination of the photovoltaic cell will result in poor electrical energy generation efficiency and possible damage of the photovoltaic cell 100.

Offset Tile Fresnel Lens Design

Figure 8:
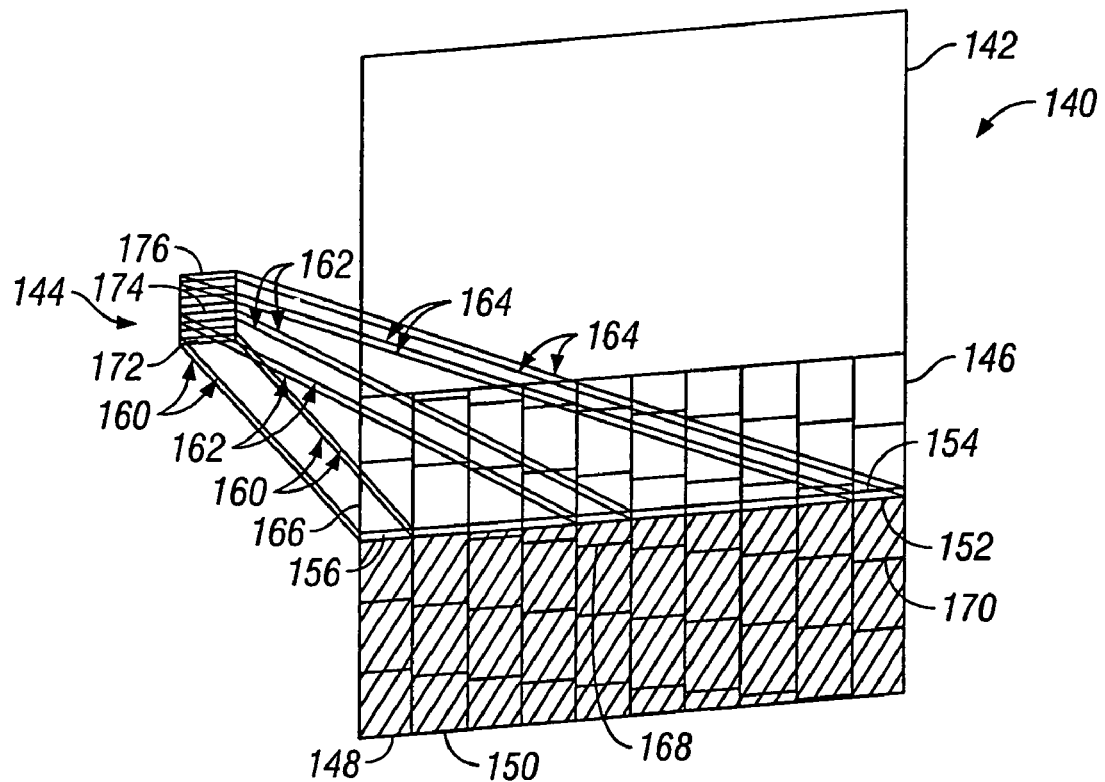
FIG. 8 is a perspective view of a partially shaded, offset-tiled Fresnel lens with target.

FIG. 8 illustrates one embodiment of a shadow-tolerant lens 140 that may serve as a section of roof lens on a pontoon solar collector. In this embodiment, upper half 142 of the lens 140 is never shadowed by the neighboring pontoon solar collector, and therefore the light from this entire subregion of the lens 140 is simply directed uniformly to the surface area of target cell 144. The lower half of the lens 146, at various times, may be partially or entirely shaded by the neighboring pontoon collector depending upon the sun elevation. The lower half of the offset tile Fresnel lens 146 is tiled. Each tile (which is a contiguous subregion of the overall lens) directs the light it receives substantially uniformly toward the target. Thus, shading on any one tile affects light distribution on the target only according to the proportion of that tile area to the entire illuminated area of the lens 140. Accordingly, illumination irregularities are attenuated on the target just by virtue of using subregions, such as tiles, that each direct light uniformly to the target.

However, FIG. 8 also illustrates how offsetting tiles from one another, compared to an expected shadow line, can reduce target illumination imbalances even farther. Each tile is shown offset by 1/10 of a tile width for the tiles from 166 to 154. Looking at slices 1/10 tile wide in each of those tiles, it will be seen that slices in adjacent tiles that fall along the expected shadow line each map to a different part of the target 144, effectively spreading out the uneven illumination over the entire surface of the target.

From one tile column 148, to the next tile column 150, the tiles in the columns are offset vertically from one another. The shading of the roof lens 140 by the neighboring pontoon solar collector creates a horizontal shade line 152. One-tenth of a tile height above the horizontal shade line 152 is a conceptual line 154 showing the upper limit of a conceptual composite tile 156. The light rays 160, 162 and 164, which have passed through the conceptual composite tile 156, are shown for tiles 166, 168 and 170. The corresponding locations where light is received by the photovoltaic cell 144 are shown as 172, 174 and 176. Light rays from only three tiles (166, 168 and 170) are shown for clarity, but when all ten columns of the conceptual composite tile 156 direct their portion of light rays towards the photovoltaic cell 144, the result is an evenly illuminated photovoltaic cell 144.

In the example lens that is illustrated, the largest illumination variation due to partial shading of the vertically offset tile lens occurs when 49.5 percent of the vertically offset tiled lens 140 is shaded, resulting in a variation in illumination of about two percent across the surface of the photovoltaic cell 144. When 0.5 percent of the vertically offset tile lens 140 is shaded, a one percent illumination variation across the surface of the target 144 results. Percent variation in illumination at the target is inversely related to the area of the subregions of the lens that remain evenly illuminated. The illumination variation at the photovoltaic cell due to lens shading relationship may be described by the following equation:

$$\% \text{ illumination variation} = (10000/(Yn^2))$$

where n>1, and represents the number of square tile rows across the region of the Fresnel lens focusing onto one target, and 100>Y>50 represents the percentage of the roof lens that experiences solar radiation. This relationship holds for a square lens and tiles, with a point focus. Other relationships would hold for other shaped lenses and tiles, which still apply the above-described concept. Note that Fresnel lenses and Fresnel-like lenses are a very appropriate technology for roof lenses. Though not necessary, they are frequently used because they are generally less expensive than other types of lenses.

In another embodiment of the offset tile lens 140 the entire surface area of the lens 140 may be composed of offset tiles as shown in the roof lens of the pontoon solar collectors in FIG. 1, which may simplify fabrication and assembly of the lens onto the pontoon solar collector 30. The tile size in such a lens may be the same size as the target size, with no magnification performed by each tile. Such a lens achieves concentration by the number of tiles directing light towards the target photovoltaic cell 144. In general, concentration will be equal to overall lens area divided by target area.

Fresnel lens technology allows magnification to be performed by each tile, enabling the number of tiles to be reduced. However, as the tile size on the lens is increased, the variation in illumination due to partial shading of the lens is also increased at the photovoltaic cell 144. For a given number of tiles, light magnification by each tile allows the photovoltaic cell 144 size to be reduced, which increases the overall magnification of the lens 140. Tile offset from column to column may be uniform, and helps achieve an even illumination at the photovoltaic cell 144. The size of the tile offset may be 1/n of the vertical height of a tile, where n is the number of square tiles in a row across the region of the Fresnel lens focusing on one photovoltaic cell. When n=10, meaning that there are ten columns of offset tiles directing light towards one photovoltaic cell, each tile may be offset 1/10 of the tile height from its neighbor to help effect uniform light distribution at the photovoltaic cell 144. Photovoltaic cell 144 would be placed in thermal contact with the heat exchange element 96 contained in FIG. 3, when applied to the pontoon solar collector 30.

Figure 9:
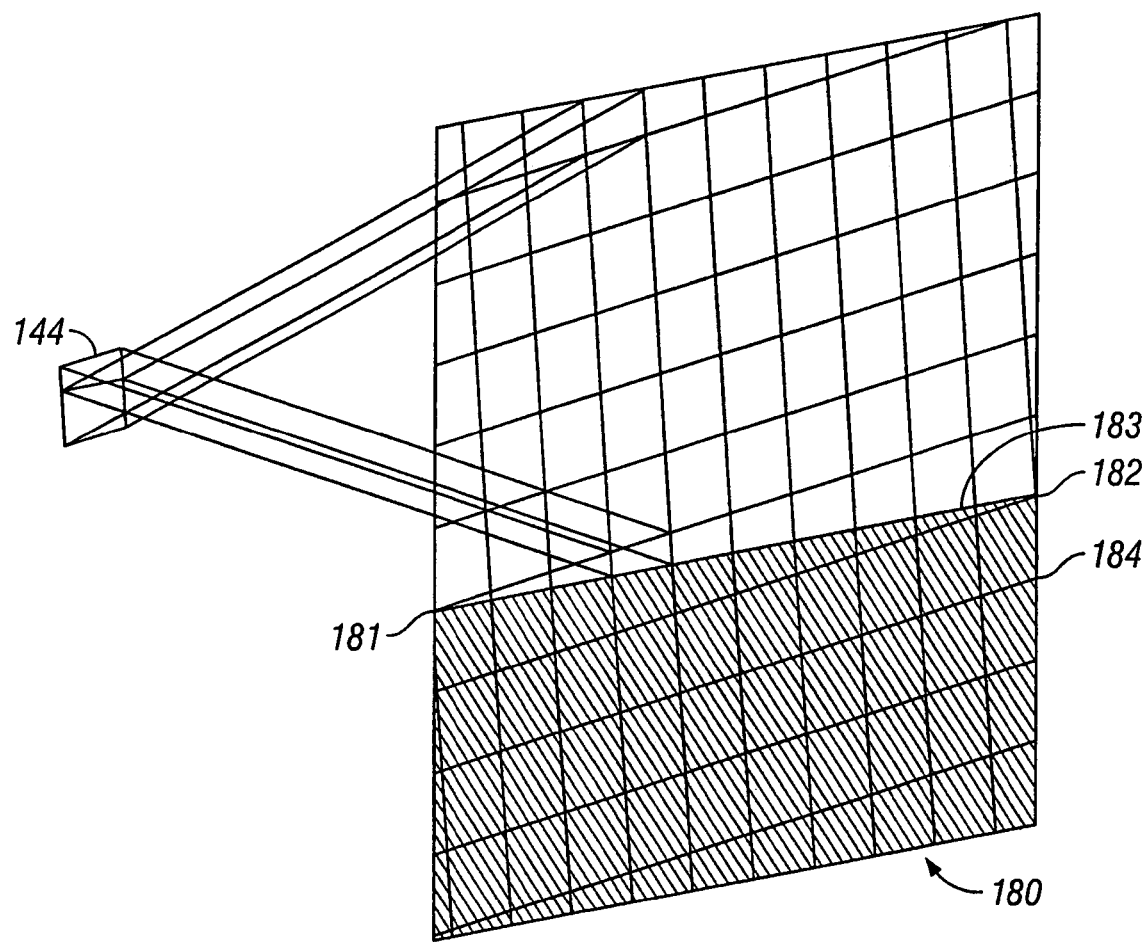
FIG. 9 is a perspective view of a Fresnel lens tiled diagonally to a partial-shade line.

FIG. 9 shows a perspective of an alternative embodiment of a shadow tolerant lens 180. Note that (though it is not a necessary condition), the shape of the target and the tiles intended to be shown is rectangular, nearly square. In this embodiment, the tiles are not offset from each other, but are aligned with each other in both axes. In this configuration, the roof lens area corresponding to a single photovoltaic cell is rotated. The amount of roof lens rotation may be adjusted such that when the top left hand corner 181 of a row of tiles is just shaded by the left hand side of the neighboring collector's shade line 183, the right hand top corner of any other tile row is just shaded by the right hand edge of the shadow line 183. FIG. 9 shows the right hand top corner 182 that is just shaded by the horizontal shade line 183. This drawing shows rotation of the overall lens by an amount equivalent to one row of tile offset, but any integral number of tile row rotations will provide nearly perfect shadow tolerance. Two rows of tile rotation, for example, would cause the area near 184 to be just shaded by the right hand side of shade line 183. When using this type of rotation in the roof lens tile pattern, the target photovoltaic cell 144 may also be rotated to simplify mapping the light from tiles uniformly over the target. Rotation of the lens and cell provides a positional variation of the horizontal shadow line across each column of tiles, resulting in homogeneous concentrated light over the entire photovoltaic cell even when the lens is partly shaded along a line.

Shadow tolerance is only one benefit of the tiled lens approach to solar concentration. Tiling may also provide a more uniform illumination of the target compared to conventional Fresnel lens designs, which typically create a hot spot on a portion of the target. This hot spot degrades the overall performance of the cell by delivering too much energy to the very center of the cell, which raises the operating temperature and wastes concentrated energy that could have been used for energy generation if it were more evenly distributed across the target.

Figure 10:
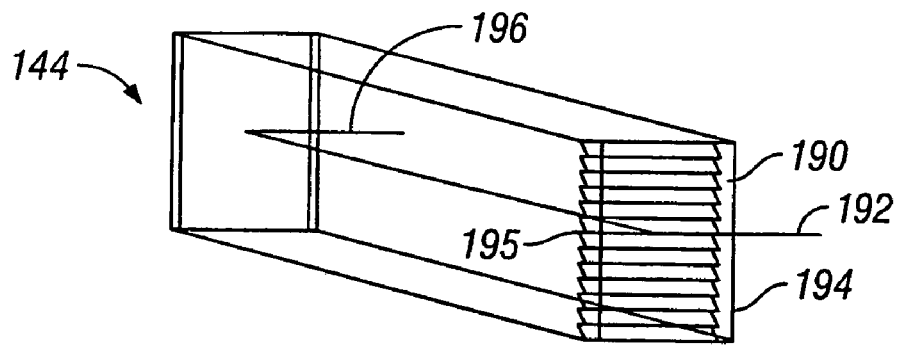
FIG. 10 is a perspective view of a target with a single tile from a Fresnel lens.

FIG. 10 shows a single Fresnel tile 190 of an offset tile Fresnel lens in relationship to a target 144. A light ray 192 is entering normal to the smooth outer surface 194 of the tile 190. As the light ray 192 exits the tile 190, the faceted face 195 bends the light ray 192 towards the photovoltaic cell 144. A normal vector 196 of the target 144 (presumed, for this purpose, to be parallel to the normal vector of the lens and thus of the smooth face 194) is shown as a reference indicating the amount of refraction taking place within the tile 190. Depending upon a position of tile 190 within the overall roof lens of which it is a part, the Fresnel facets within the tiles may need to be rotated to most easily achieve the correct direction of refraction to ensure the light is properly directed to the photovoltaic cell 144. The angle of each Fresnel facet will also need to be changed depending upon each tile's position on the roof lens. Magnification of the light passing through an individual tile can also change the Fresnel facet shape and orientation while still applying this principle. Facet size and number should be determined by lens fabrication factors while adhering to the lens features that provide point focused shadow tolerance.

To provide the feature of shadow tolerance, the shape of the tile does not have to directly correspond to the shape of the target. Rectangular (non-square) tiles on the lens may be used with a square target, with magnification along one axis (e.g., length or width) of the tile unequal to magnification in the perpendicular axis.

Line Focus Fresnel—Type Lens Design

Figure 11:
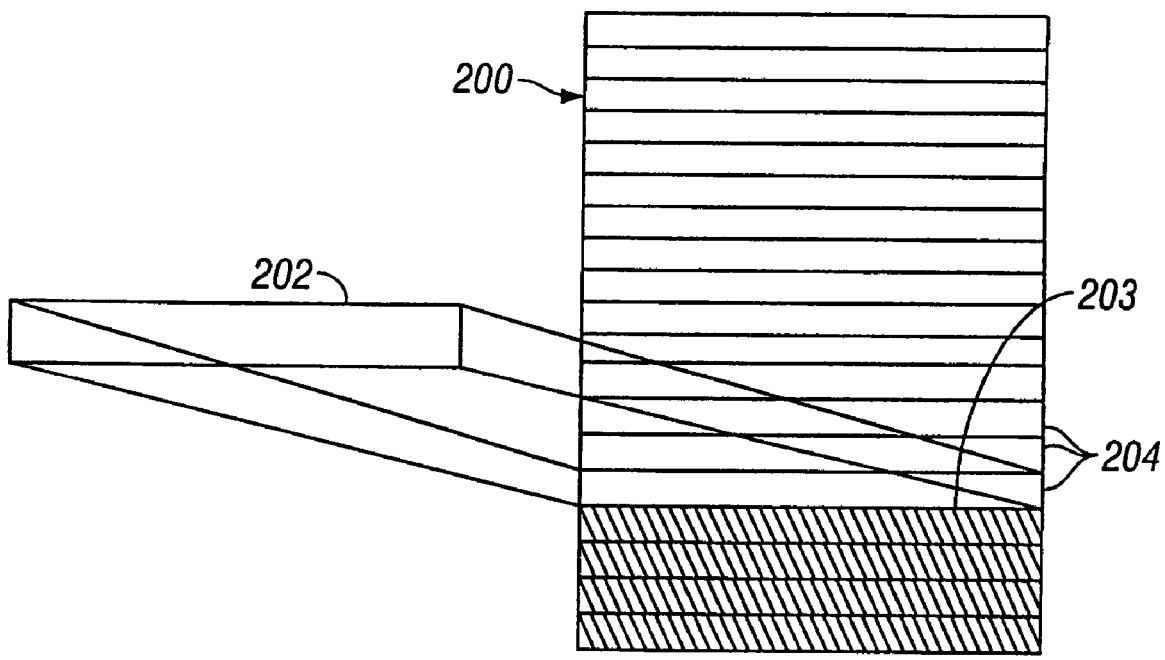
FIG. 11 shows a partly shaded, shadow tolerant line focus tiled Fresnel lens.

FIG. 11 shows a line focused Fresnel roof lens 200 with a tiled refraction pattern. The tiled line focused lens 200 may have long narrow tiles 204, each running parallel to an expected shadow line 203 (e.g., created by the neighboring solar collector). The width of the narrow tiles 204 may be adjusted in relation to the photovoltaic target size and the amount of illumination variation that is acceptable for the photovoltaic target 202. To increase the tiled linear focus lens's ability to deliver homogeneous light when partially shaded, the narrow tiles 204 may be thinner than the width of the photovoltaic target, with each tile 204 comprised of a converging lens or negative focal line to fan the light out across the photovoltaic targets 202 (which is wider, in this case, than the tile) as shown in FIG. 11. The narrower each tile becomes, the smaller surface area percentage a single narrow tile will have in relation to the entire surface area of lens 200, reducing the effect of shadowing. The practical limit of this concept would involve each facet face of the linear Fresnel lens being curved in such a manner that each Fresnel facet distributes the light passing through its surface uniformly across the target, such that each Fresnel facet is a subregion for uniform distribution over the target. When one facet is partially shaded, the surface area of the facet is small compared to the illuminated portion of the overall lens, so that illumination variation at the photovoltaic target is minimal. Each the facet face could be shaped with a slight concave profile. The concave profile to cause the light passing through each facet to be evenly distributed on the photovoltaic target. The photovoltaic target 202 will be placed in thermal contact with the heat exchange element 96 shown in FIG. 3, and roof lens 200 will be positioned similarly as described with respect to the roof lens 24 in FIG. 3. Note that with long thin tiles, as shown in FIG. 11, a very slight rotation of the overall lens (and, generally, target too) with respect to the expected shadow line will enhance shadow tolerance even farther.

Optical Solar Tracking System-Elevation Configuration

Figure 12:
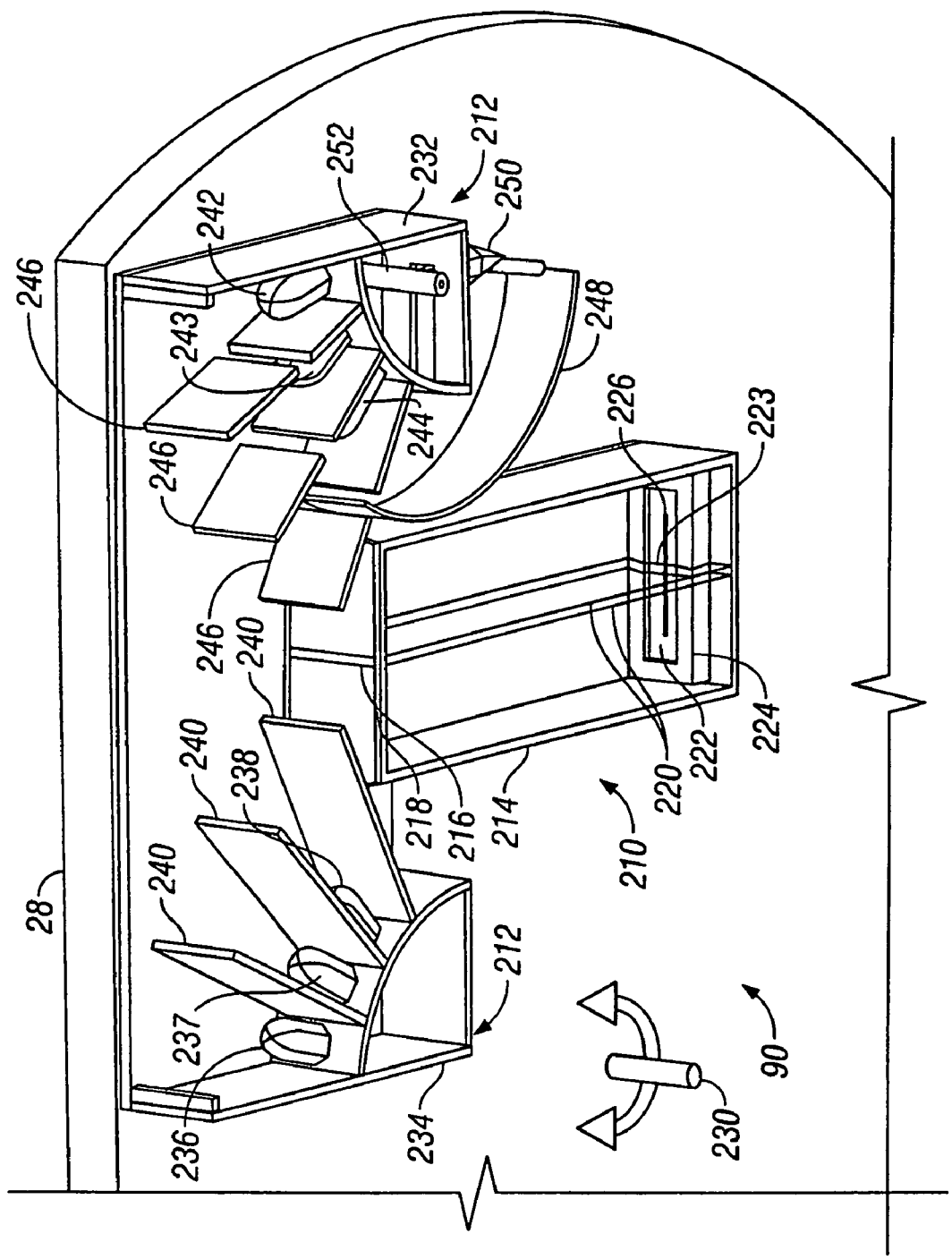
FIG. 12 is a perspective view of an optical solar elevation tracker mounted on a pontoon collector end cap.

FIG. 12 shows an elevation-tracking configuration of the optical solar tracking system 90 that has two major optical components, an accurate tracking subsystem 210 and a wide angle tracking subsystem 212. The accurate tracking subsystem 210 includes a shadow box 214 which has a slit 216 and filters 218, allowing filtered light rays from the sun 220 to pass through a window 222 on the top of the optical tracker chip 224 before striking a photosensitive linear array 226. The optical solar tracking system 90 may be directly attached to the inside of one end cap 28 in a pontoon solar collector, with the slit 216 running parallel to the pontoon solar collector elevation rotation axis 230, and with the window 222 of the optical tracker chip 224 oriented normal to the incident solar irradiance when the collector is aligned with the sun's position in the sky. This configuration allows the optical tracker chip 224 to gather useful information about the orientation of the pontoon solar collector 228 with respect to the sun's position.

The quality of sunlight reaching the photosensitive linear array 226 will vary due to atmospheric conditions and impurities, resulting in variable apparent sun shape. Light that passes thorough the filtered slit 216 in the shadow box 214 will be sensed by the photosensitive linear array 226 as a variable width lighted region 223, due to the atmospheric conditions and impurities affecting the sun's apparent shape. The variable width lighted region 223 will be sensed by the photosensitive linear array 226 and converted to electrical information about the sun's location and shape.

The light filter 218 over the shadowbox slit 216 may be used to eliminate much of the misleading "noise" light from the surrounding sky. The light quality algorithm contained in the optical tracker chip 224 determines an appropriate exposure time and evaluates the incoming light quality. The centering algorithm contained within the optical tracker chip 224 effectively reads the electrical information about the sun's location and proportionally activates the pontoon solar collector's motors to position the variable width lighted region 223, to the center of the photosensitive linear array 226.

In application, the slit 216 may be the only opening for light in the shadow box. The narrow acceptance angle of the accurate tracking subsystem 210 described above may be supplemented with a wide angle tracking subsystem 212 to facilitate sensing the sun throughout the range of motion of the pontoon solar collector. The wide angle tracking subsystem 212 includes a low sun sensor section 232 and a high sun sensor section 234. The high sun sensor section 234 may employ phototransistors (or other opto-electrical sensitive devices) 236,237,238, and partitions 240. These items may be positioned to determine when the sun is "higher" in the sky than can be sensed by the accurate tracking subsystem 210. Similarly, the low sun sensor portion 232 may consist of phototransistors or some other opto-electrical sensitive devices 242,243,244, and partitions 246, positioned to determine if the sun is "lower" in the sky lower than can be sensed by the accurate tracking subsystem 210. The phototransistors 236-238 and 242-244 may be wired to the optical tracker chip 224, which uses the information provided thereby to decide a direction of motion required to position the pontoon rotation within range of the accurate tracking subsystem 210.

A condition in which both phototransistor 236 and 242 receive sunlight at the same time may be recognized to trigger the accurate tracking subsystem 210 to begin controlling the collector's actuator, increasing the accuracy of the tracking. Since most elevation tracking systems have neighboring collectors, an optical blind 248 may be used to keep the lower sun sensor half 232 from "seeing" neighboring collectors and therefore providing false tracking information during low sun height operation. The optical blind 248 operates passively, with gravity acting upon the blind's counter weight 250 as it pivots around its axis 252 of rotation. As the pontoon solar collector 228 rotates around its axis, the optical blind 248 moves to shield phototransistors 244,243 and will ultimately shield a portion of phototransistor 242 when the pontoon solar collector has reached it minimum sun height tracking angle. As an alternative embodiment, the elevation tracking system could be attached to the exterior of a pontoon; additionally the motor/gearbox could also be mounted to the exterior of the pontoon solar collector.

Recent advancements in the semiconductor industry's development of systems on a chip (SoC) technology allows for a single integrated circuit to be used to detect incident sunlight, process the sun's location, determine the amount of positional correction required to align with the sun, and amplify a proportional output signal directly to an electro-mechanical actuator. The relatively simple nature of the centering algorithm assures its ability to be implemented by current SoC technology. The task of two-axis tracking can be effectively executed by tracking the sun with two, single-axis tracking systems. The addition of two subsystems for tracking the sun's position in the sky is easily offset by the simplicity and lower cost of the single axis tracking systems. The floating pontoon's concentrating roof lens and optical solar locating system both require a similar quality of sunlight to operate effectively so their use in the same solar energy system is a good match.

Optical Solar Tracking System-Azimuth Configuration

Figure 13:
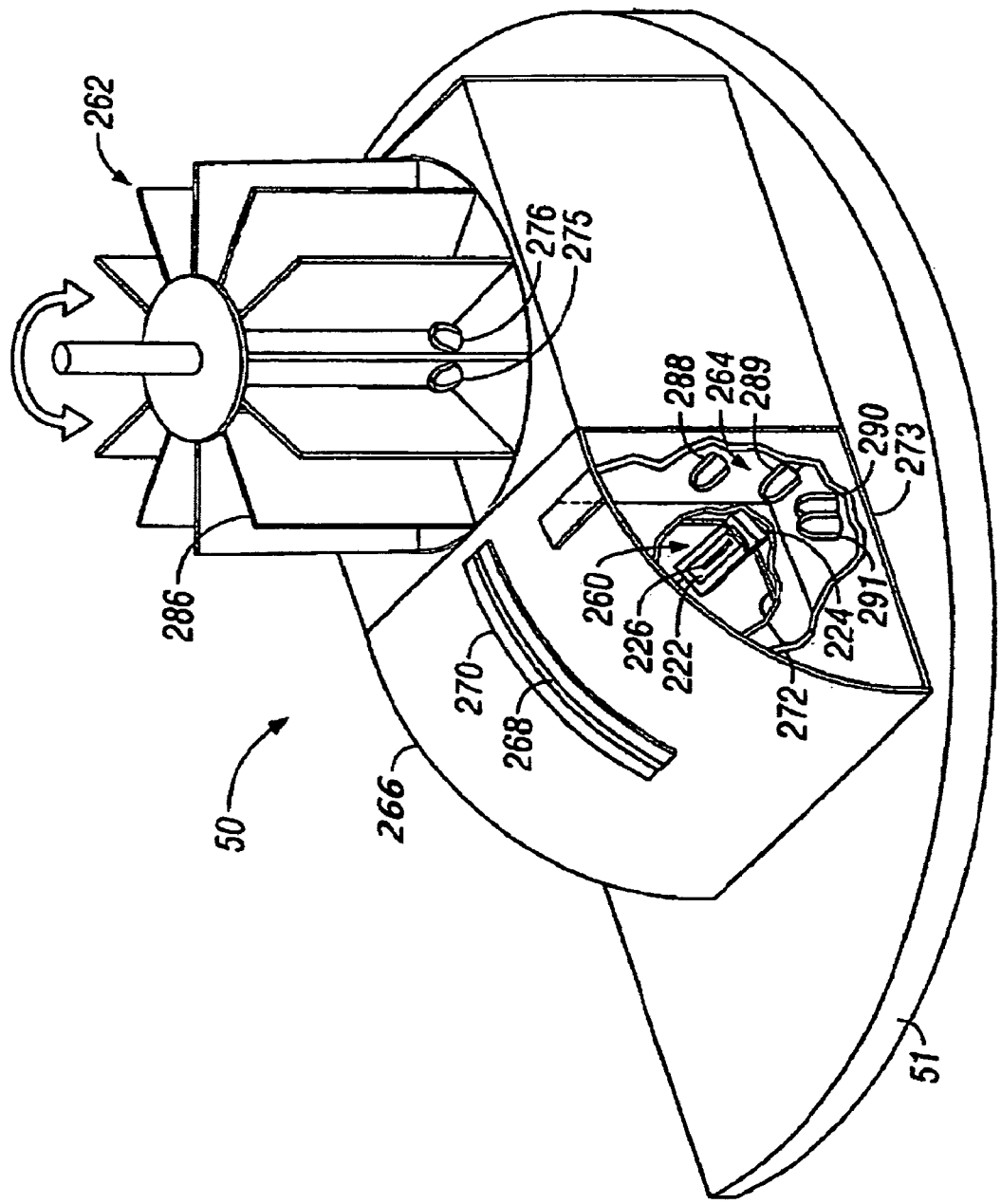
FIG. 13 is a perspective view of optical solar azimuth tracker apparatus.

FIG. 13 shows an azimuth tracking application of the optical solar tracking system. The optical solar azimuth tracking system 50 may include three major optical components, an accurate tracking subsystem 260, a wide angle tracking subsystem 262, and a sun height detection system 264.

The accurate tracking subsystem 260 may include a shadow box 266 which has a slit 268 and filters 270, allowing filtered light rays 272 to pass through a window 222 on the top of the optical tracker chip 224 before striking a photosensitive linear array 226. The optical tracker chip 224 may be angled relative to the bottom of the shadow box 273 to allow the optical tracker chip 224 to sense the light source azimuth for all operational sun heights of the pontoon solar collectors. The bottom 273 of the shadow box 266 may be directly attached to the base plate 51, which in turn may be connected to the pontoon solar collector array's perimeter ring, providing azimuth orientation information about the array alignment with respect to the sun.

When the sun's rays have been detected upon the photosensitive linear array 226 and the data processed, the optical tracker chip 224 will output appropriate electrical signals to the pontoon solar collector's azimuth actuator motor. The slit 268 in shadow box 266 may be the only light opening in the accurate tracking subsystem 260 portion of the shadow box 266. The narrow acceptance angle of the accurate tracking subsystem 260 described above may be supplemented with a wide angle tracking subsystem 262 to facilitate sensing the sun throughout the sky.

In an azimuth tracking application, the wide angle tracking subsystem 262 may be designed to sense the entire 360 degree sky, wide-range sensing which may be effected with a series of phototransistors, or any other appropriate opto-electrical sensing devices, all pointing radially outward with partitions between each device. Phototransistors 275 and 276 are shown making up part of the wide angle tracking subsystem and may be wired to the optical tracker chip 224, which includes simple Boolean logic to activate the pontoon solar collector's azimuth actuator motor. The actuator motor moves the collector towards the sun such that both phototransistors positioned around partition 286 are pointed directly at the sun, at which position the accurate tracking subsystem 260 may be engaged to increase the tracking accuracy. Partition 286 should be in line with the sun when the azimuth of the solar collector is aligned with the sun's rays, assuring that the shadow box's slit 268 is passing sunlight to the exact middle of the photosensitive linear array 226.

In an azimuth tracking application, for a given amount of misalignment between the collector's orientation and the sun's orientation in the sky, the duration of the tracker's output pulse width may be increased with increased sun height. A sun height detection system 264 wired to the optical tracker chip 224 enables the optical tracker chip 224 to sense the sun's height in the sky and increase the electrical pulse duration to the pontoon solar collector's azimuth actuator motor. The sun height detection system 264 may consist of phototransistors 288 thru 291 or some other opto-electrical sensitive devices, positioned beneath a window 292 within the sun height portion of the shadow box 266 which allows the sun's rays to strike different phototransistors when the sun is at different elevation angles to the detection system. Suns rays striking phototransistor (or other device) 288 indicate that the sun position requires an increase in the tracking pulse duration. Sun striking phototransistor (or other device) 289 and 290 indicate further error, and thus may cause larger increases in tracking pulse durations.

Circuitry within optical tracker chip 224 may implement the longer duration tracking pulses as higher sun heights are encountered. Phototransistor 291 may be placed relative to the window 292 in the shadow box 266 such that it will detect the sun only when the sun is at its zenith. This situation may cause the optical tracker chip 224 to quickly rotate the azimuth axis tracking system 180 degrees, in order to enable the elevation trackers to continue to follow the sun west.

Wide Angle Sensor/Accurate Sensor Interaction

Figure 14:
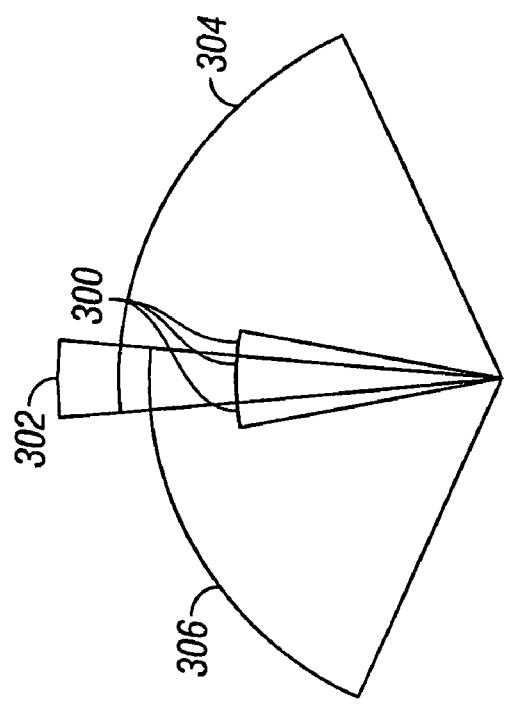
FIG. 14 shows optical angular ranges of elevation-tracking subsystems.

FIG. 14 shows an effective overlap of angular ranges of optical sensitivity for the accurate tracking subsystem and the wide angle tracking subsystem in an elevation optical solar tracking configuration. The optical sensing range 300 of the accurate tracking subsystem is centered around the optical sensing range overlap 302 between the two optical sensing ranges 304 and 306, corresponding to the high sun sensor half and low sun sensor half of the wide angle tracking subsystem used in an elevation tracking configuration. When the sun angle is within one of the optical sensing ranges 304 or 306, the phototransistors (or other appropriate opto-electrical sensing devices) will provide a signal which may be interpreted as indicating that the optical tracker chip should move the pontoon solar collector's elevation motor/gearbox toward the optical sensing range overlap 302. Once the optical sensing range overlap position 302 is reached by the pontoon solar collector, the phototransistors will indicate to the optical tracker chip 224 that the sun is positioned within the accurate tracker's optical sensing range 300, and the accurate tracking subsystem may take over tracking control.

Figure 15:
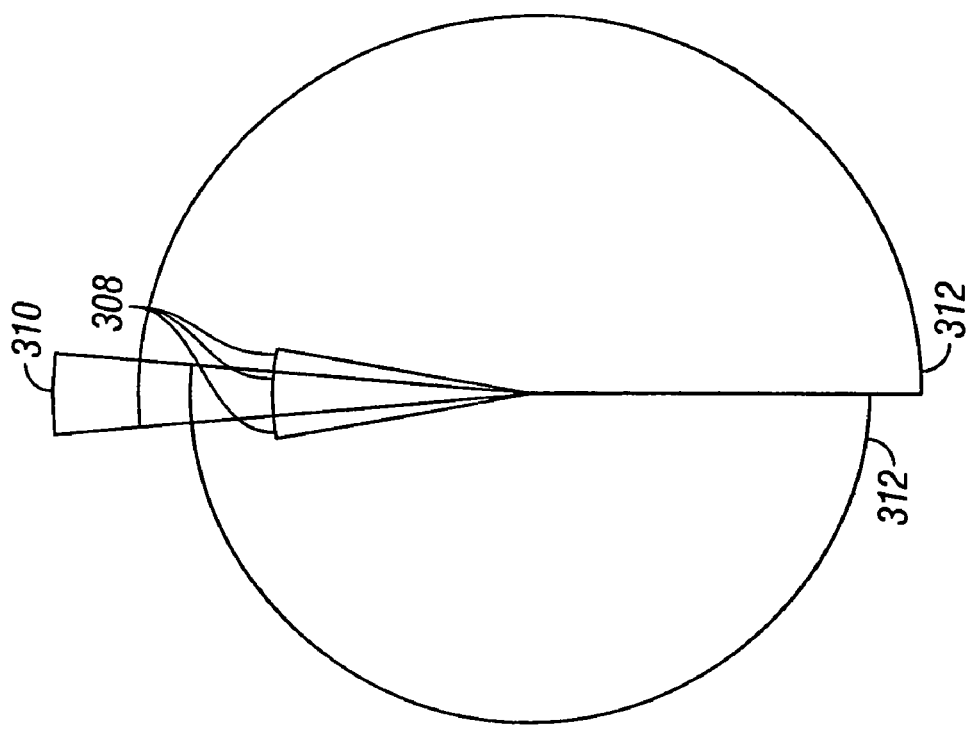
FIG. 15 is a plan view of optical angular ranges of azimuth-tracking subsystems.

FIG. 15 is a plan view of an effective overlap of angular ranges of optical sensitivity for the accurate tracking subsystem and the wide angle tracking subsystem in an azimuth optical solar tracking configuration. The optical sensing range 308 of the accurate tracking subsystem is centered around the optical sensing range overlap 310 of the optical sensing range 312 of the wide angle tracking subsystem used in an azimuth tracking configuration. When the sun is sensed within the sensing range of the wide angle tracking subsystem 312, signals from the phototransistors (or other opto-electrical sensitive devices) will indicate to the optical tracker chip 224 to move the azimuth actuator of the pontoon solar collector array, until the optical sensing range overlap position 310 is reached by the collector. Once the optical sensing range overlap position 310 is reached by the pontoon solar collector array, the phototransistor signals will indicate to the optical tracker chip 224 that the sun is within the accurate tracker sensing range 308, and the accurate tracking subsystem may take over tracking control.

Accurate Sensor Operation

Figure 16A:
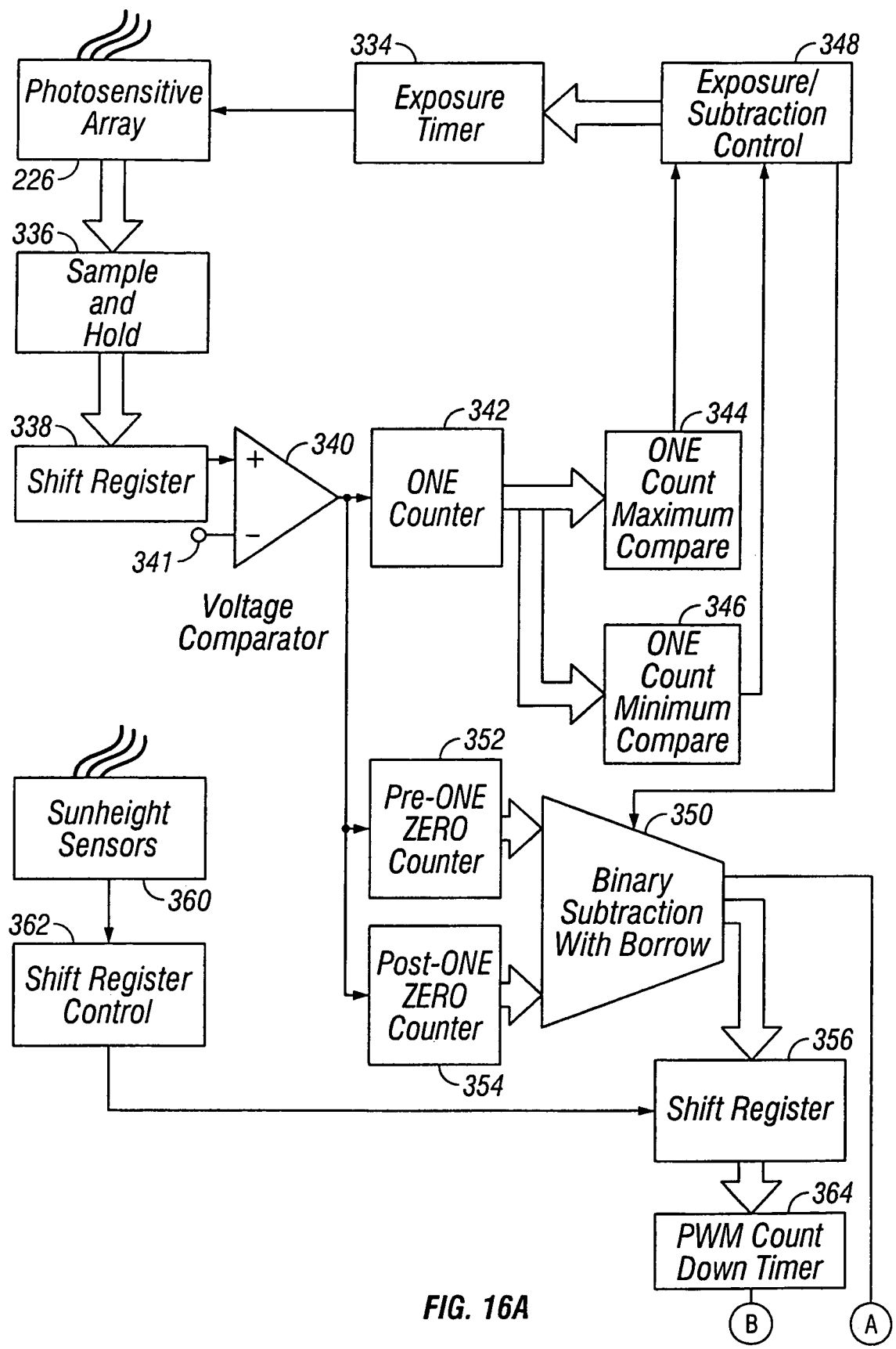
FIGS. 16A and 16B depict a functional block diagram of an optical tracker circuit.
Figure 16B:
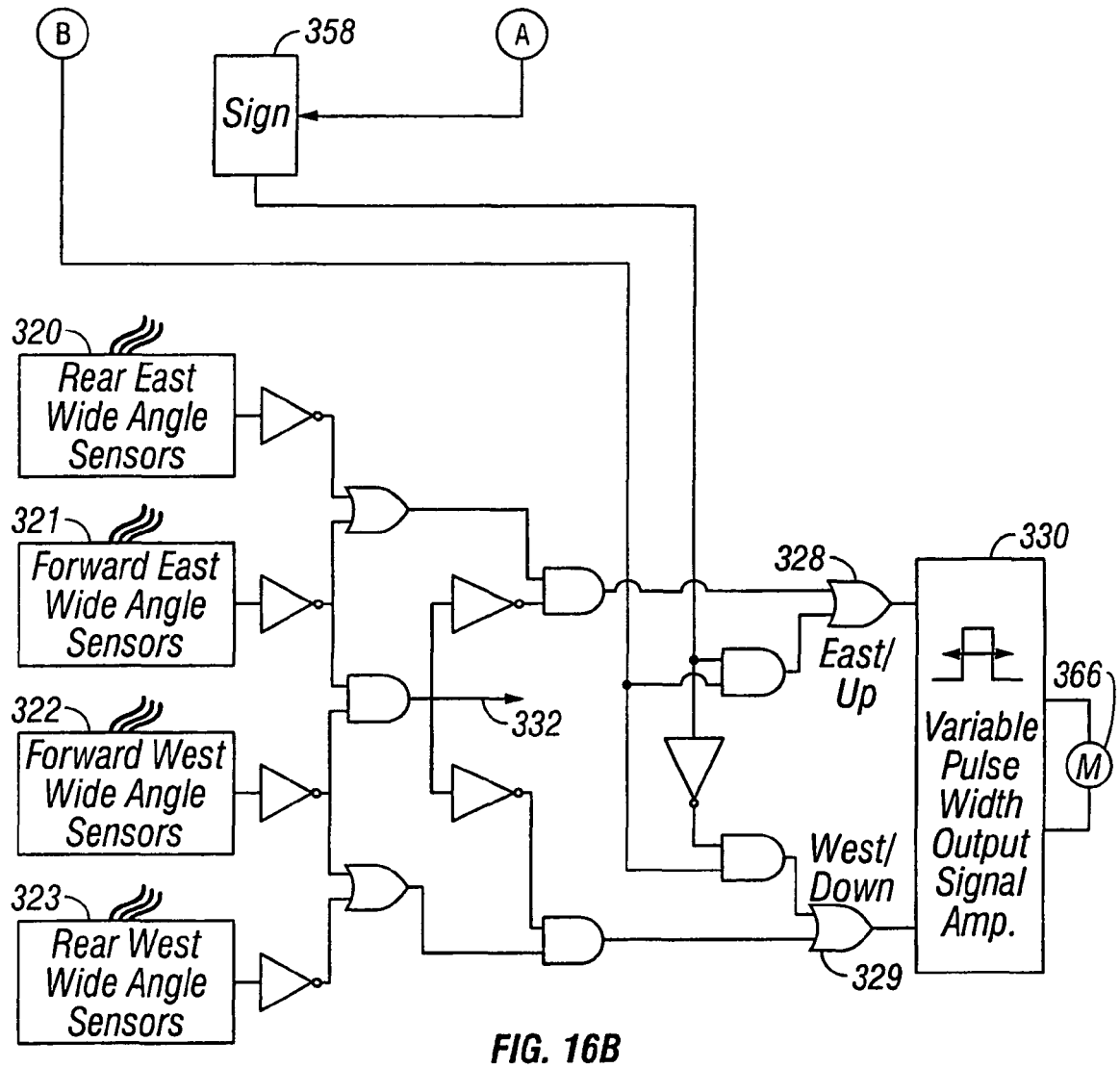

FIGS. 16A and 16B show a functional block diagram of the optical solar tracking system showing the functions used in the light quality algorithm and centering algorithm to process optical data from various sensors into an output electrical control signal used by the solar collector's actuator to facilitate accurate tracking of the sun's position in the sky. The wide-angle sensors 320, 321, 322, and 323 are used by the wide angle subsystem, to direct the tracker close enough to the sun that the photosensitive linear array 226 can begin to accurately track the sun's position. Simple Boolean logic is used to translate the wide-angle sensor data into logical outputs, which are logically OR-ed 328, 329 with the accurate tracking subsystem outputs before being amplified by the Variable Pulse Width Output Signal Amplifier 330. When both the Forward East Wide Angle Sensor 321 and the Forward West Wide Angle Sensor 322 are illuminated by the sun at the same time, corresponding to the optical sensing range overlap described in FIGS. 14 and 15, which indicates that the wide angle tracker is effectively in line with the sun and outputs a logic "1" on signal 332, and enables the accurate tracking subsystem to begin operation.

Algorithm to Determine Appropriate Exposure Time and Evaluate Incident Light Quality In FIGS. 16A and 16B, light rays that have passed through a filtered slit in a shadow box strike a photosensitive linear array 226. An exposure measurement cycle is initiated by clearing the photosensitive linear array 226 of any past light exposure effects and setting the exposure timer 334, to a minimum count value. When the exposure timer 334 times out, indicating sufficient exposure time has elapsed, electrical charge proportional to the amount of sunlight striking each segment of the photosensitive linear array 226 is loaded into a sample and hold register 336. The contents of the sample and hold register 336 are loaded into a shift register 338, which sequentially outputs an analog voltage proportional to the amount of sunlight seen by each segment of the photosensitive linear array 226. The output of the shift register 338 is digitized bit by bit with a voltage comparator 340, using an external reference voltage 341 to define the threshold voltage required to indicate the presence of light on each photosensitive linear array segment.

For the purposes of this description, a logical "1" represents a photosensitive linear array segment that has experienced sunlight during an exposure period. Depending upon the type of photosensitive linear array 226 that is used, the logic value representing the presence of light may be logic zero. If a reverse logic light sensing technology is used, the following algorithm would be unchanged, but the logic values would be reversed throughout the following description.

As each segment's voltage is digitized by the voltage comparator 340 and put into the serial data stream, three binary counters monitor and record the data. The ONE Counter 342 monitors the serial data stream, counting the number of photosensitive linear array segments that experienced sufficient light to be registered as a logical "1" by the voltage comparator 340. Proper exposure of the photosensitive linear array 226 can be determined when the number of logical "1's" is within a predetermined range. The ONE Count Minimum Comparator 346 holds a binary count value corresponding to the number of logical "1's" expected from the photosensitive linear array 226 when exposed to the clearest of sky conditions. The ONE Count Maximum Comparator 344 holds a binary count corresponding to the number of logical "1's" expected from the photosensitive linear array 226 when exposed to the haziest conditions that accurate tracking can be reliably performed. After all the segments of the photosensitive linear array 226 have been digitized and counted for the minimum exposure time, the content of the ONE Counter 342 is loaded into the ONE Count Maximum Comparator 344 and the ONE Count Minimum Comparator 346.

The results of the ONE Count comparisons are routed to the Exposure/Subtraction Control 348, which records the results for the minimum exposure time as underexposed if the number of logic "1's" sensed by the photosensitive linear array was too low to surpass the ONE Count Minimum. Within a fraction of a second, the results of multiple exposures, each with progressively longer exposure time periods, are sensed, digitized, compared, and then recorded in Exposure/Subtraction Control. As the exposure time is increased, the data sensed by the photosensitive linear array will vary depending upon the external light conditions. As the exposure times continue to increase, the photosensitive linear array will become overexposed by the incident sunlight. Overexposure is indicated by the number of logic "1's" sensed by the photosensitive linear array exceeded the ONE Count Maximum. Because all the exposures are performed within a fraction of a second, the variation in the sky's conditions can be considered negligible.

There will be some exposure times that allow the photosensitive linear array to record a number of logical "1's" between the ONE Count Minimum Compare and the ONE Count Maximum Compare values. When an exposure is between the maximum and minimum, the exposure can be considered an appropriate exposure for the current light conditions. The number of appropriate exposures obtained during the increasing exposure time process will give an indication of the light quality being experienced by the photosensitive linear array. If only one appropriate exposure is measured, that would indicate that the incident light conditions are diffused with little columnar light coming directly from the sun. If there were three or four exposures considered appropriate for the current incident light conditions, it would indicate good columnar light being received. From this information the Exposure/Subtraction Control 348 can determine whether to attempt to track the sun because of good light quality or wait for changing sky conditions before making any actuation changes. This reduces the controller's likelihood of being fooled by bright spots in the sky or hunting for the sun when it is behind thick clouds.

With several appropriate exposures measured, the Exposure/Subtraction Control 348 can determine the best exposure time for the current sky conditions. The exposure time determined the best is then re-loaded into the Exposure Timer 334 and another exposure is taken. The results of the best exposure are sensed by the photosensitive linear array 226 and digitized as described above. Comparisons of the ONE Counter data are once again performed on the best exposure and if it is determined to be within the appropriate range, the exposure measurement cycle is complete and the algorithm that generates the actuator motor control signal can begin. If the sky conditions have changed to the point that the best exposure time does not create an appropriate exposure, the exposure measurement cycle will restart with the minimum exposure time and re-evaluate the sky's condition.

Algorithm to Transform Optical Data into Proportional Motor Control

Once the results of the best exposure are sensed by the photosensitive linear array 226, they are digitized and placed onto a serial data stream as described above. While the ONE Counter 342 is monitoring the serial data stream, a Pre-ONE ZERO Counter 352 and a Post-ONE ZERO Counter 354 are also monitoring the serial data stream. The Pre-One Zero Counter 352 counts the number of logical "0's" sensed by the photosensitive linear array 226 during the measurement cycle, before a series of logical "1's" are encountered in the serial data stream. The Pre-One Zero Counter 352 data gives positional information about where the rays of sunlight light begin on the photosensitive linear array 226. The Post-One Zero Counter 354 monitors the serial data stream for each segment produced by the voltage comparator 340 and only begins to count the number of logical "0's" in the serial data stream, following the series of logical "1's" corresponding to the sunlight which passed through the slit and filters in the shadowbox before striking the photosensitive linear array 226. The Post-One Zero Count 354 data gives positional information about where the rays of sunlight end on the photosensitive linear array 226.

If the comparisons of the ONE Counter 342 indicate the best exposure is still appropriate, the Exposure/Subtraction Control 348 initiates the Binary Subtraction With Borrow 350. The binary subtraction determines the difference between the contents of the Pre-ONE ZERO Counter 352 and the Post-ONE ZERO Counter 354: Since these counters hold positional information about the location of the logical "1's" block on the photosensitive linear array, the difference between these two counters will represent the amount of movement required to align the shadowbox with the sun's rays. When the Binary Subtraction With Borrow Unit 350 subtracts the binary contents of the Post-One Zero Counter 354 from the binary contents of the Pre-One Zero Counter 352 the resultant is loaded into the shift register 356. Once loaded, the shift register 356 is shifted one bit to the right effectively dividing the contents of the shift register by two. The binary value of the sign of the subtraction is held in the sign flip-flop 358 and indicates the direction of the tracking motion required to align the collector to the sun's rays.

At this point in the centering algorithm, shift register 356 contains the binary difference between the number of zeros (number of photosensitive liner array segments that have not been exposed to sunlight) on each side of the variable width light spot that was sensed by the photosensitive linear array. If there were an equal number of zeros sensed on each side of the variable width light spot, that would indicate that the variable width light spot is in the middle of the photosensitive array and no motion is required to align with the suns rays and shift register 356 following the centering algorithm would contain a binary zero value. If there were twenty two more zeros in the Post One Zero Count 354 than in the Pre One Zero Count 352, it would indicate that the collector needed to move eleven segments to the east, to center the variable width light spot on the photosensitive array and following the centering algorithm, shift register 356 would contain a binary value of eleven, with a negative sign flip flop 358, indicating direction. If there were twenty two more zeros in the Pre One Zero Count 352 than in the Post One Zero Count 354, it would indicate that the collector needed to move eleven segments to the west and the sign flip flop 358 would indicate a positive sign.

The sun height sensors 360 monitor the sun's elevation in the sky and are wired to the input of the shift register control 362. In an azimuth tracking application, where high sun heights require a longer pulse duration to perform tracking, the shift register 356, can be instructed by the shift register control 362, to shift the shift registers contents towards the left by one two or three bits, effectively elongating the tracker's output pulse because of the height of the sun in the sky.

Once the shift registers contents 356 have been shifted, its contents are loaded into a PWM count down timer 364, who's output goes high until the timer times out, at which point the PWM count down timer 364 output stays low until it is loaded again. Simple Boolean logic is implemented to turn the PWM count down timer 364 and sign 358 flip flop into discrete signals which are routed to the input of the Variable Pulse Width Output Signal Amplifier 330, which amplifies the signals to be used by the solar collector's actuator motor 366.

Figure 17A:
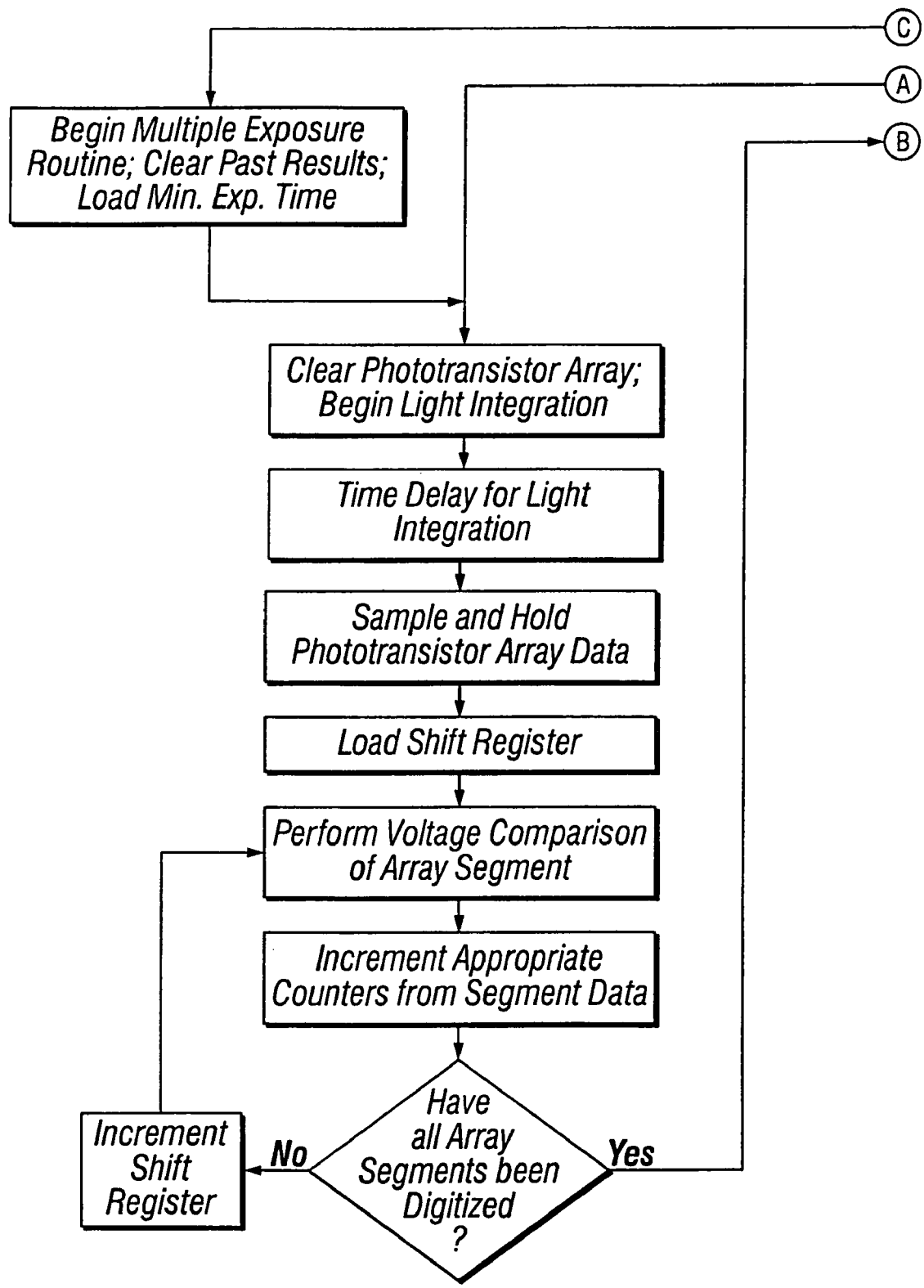
FIGS. 17A and 17B are a flow chart of steps for processing photosensitive linear array data.
Figure 17B:
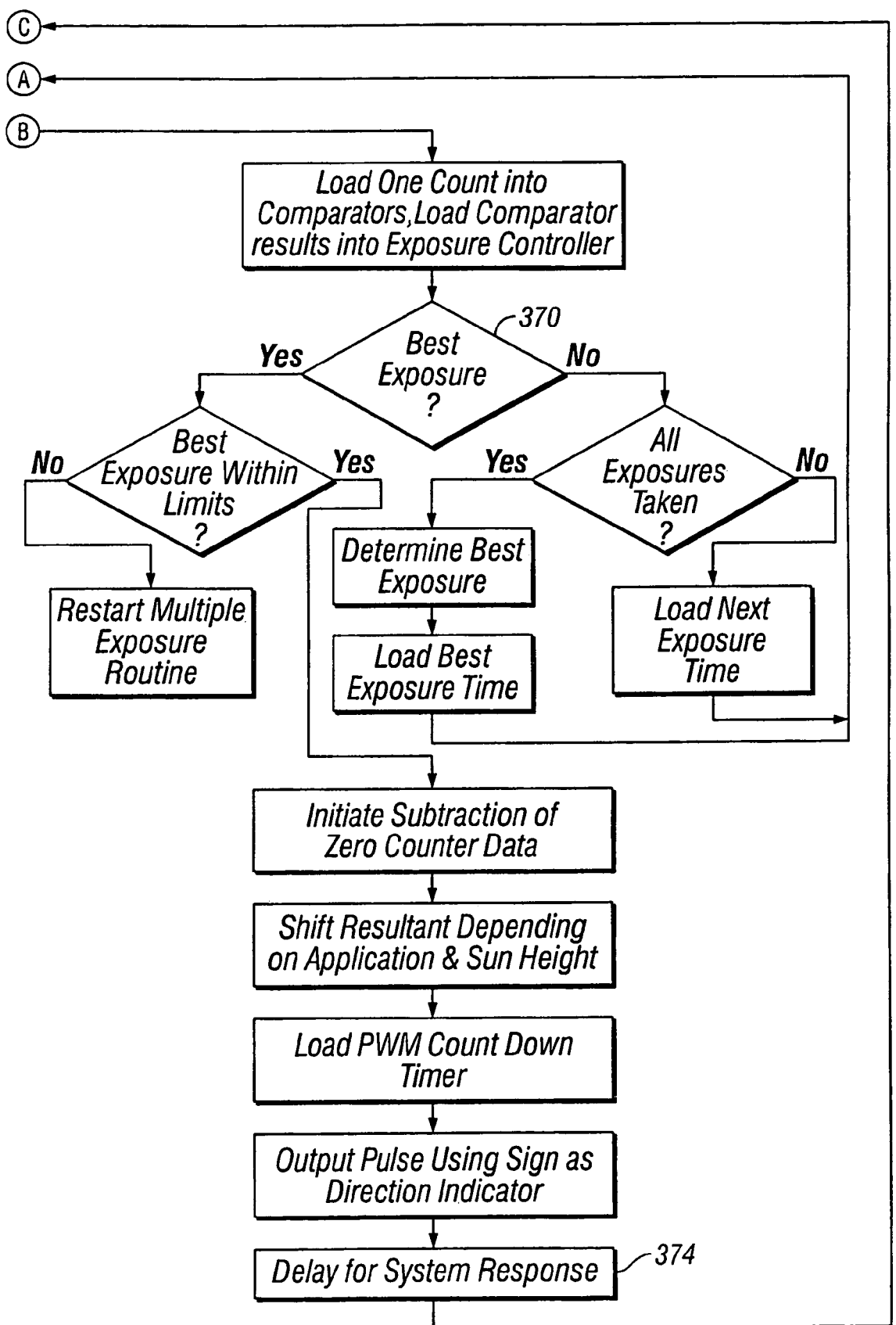

FIGS. 17a and 17B shows a flow chart showing the steps that the accurate tracking subsystem performs to translate the photosensitive linear array imagery data into solar collector proportional electrical actuator signals. Previous figures have described most of the process in detail. The decision box 370 is used to determine if the last exposure was taken as the best exposure determined by the Exposure/Subtraction control. If it was the best exposure time, and the One counter shows the exposure is not within acceptable limits, the exposure/subtraction controller is reset and the multiple exposure routine begins again. This loop allows the system to continually evaluate the sky's light condition without having to output actuator control signals during times of poor light quality. To remain within $\frac{1}{10}^{th}$ of a degree in accuracy, the system must align with the sun's rays once every 24 seconds. This leaves a lot of time available to process sky conditions and determine the correct actuation needs. One condition that may require multiple samplings of incident sunlight is when the atmosphere varies as moisture levels between the sun and sensor are changing due to windy moist conditions. This type of condition could cause sensing errors from moment to moment. To reduce the effect of such conditions resulting in erroneous tracking, the centering algorithm could be performed a number of times in a short time period. The data could be compiled and averaged to generate a more reliable control signal to the collector actuators. A delay is shown for system response 374 to allow the solar collector to physically stabilize before beginning the next tracking adjustment. This delay could be used to ensure that the system is not continually modifying its position, as it only required periodically.

Figure 18:
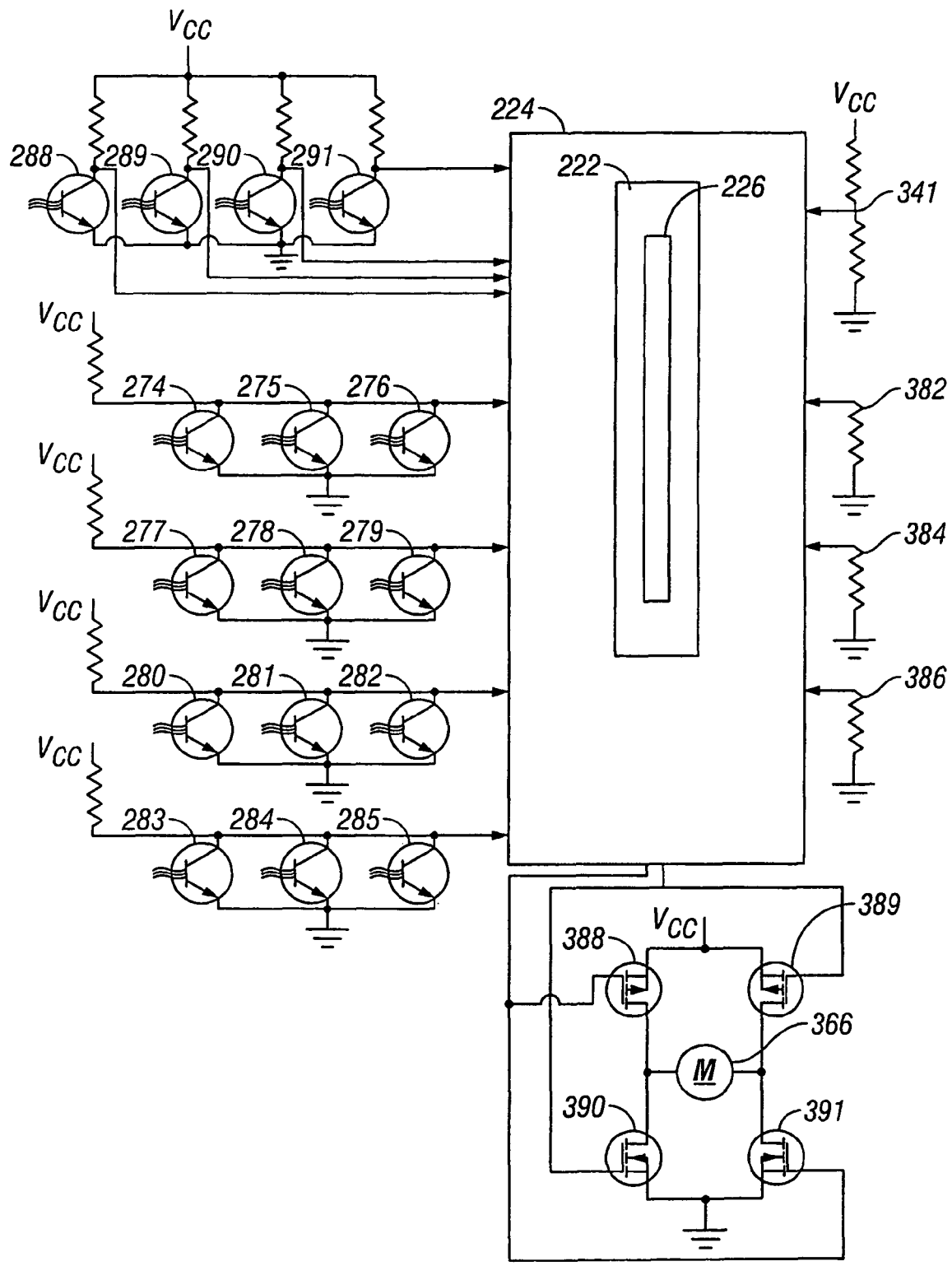
FIG. 18 schematically illustrates some components that may interface with the optical solar tracker system.

FIG. 18 illustrates an exemplary interface of an optical solar tracking system with an optical tracker chip 224, which contains an optical window 222 to protect the photosensitive linear array 226 from damage. Sun height sensors 288 thru 291 interface directly with the optical tracker chip 224, each conveying information about the sun's elevation in the sky in an azimuth axis-tracking configuration. The wide-angle sensors 274 thru 285 could be wired together in sets of three to minimize the number of pins to the optical tracker chip and simplify the system wiring. Wide angle sensors 274 thru 276 face forward towards the east, wide angle sensors 283 thru 285, face forward towards the west, wide angle sensors 277 thru 279, face rearward towards the east, wide angle sensors 280 thru 282, face rearward towards the west. An externally available comparator reference voltage 341 allows the threshold voltage of the voltage comparison performed within the optical tracker chip 224 to be varied externally, depending upon sunlight filtering and application requirements. Exposure timing could be changed by an external timing resistor 382, depending upon the filtering used to reduce the sun's intensity before striking the photosensitive linear array 226. The duration of the tracker's output pulse for a given amount of misalignment with the sun's rays could be modified to match the solar collector's actuator response by changing resistor 384. The settling time between measurement cycles could be modified by changing the value of resistor 386. The output amplifier could be external to the optical tracker chip to allow for various amplification requirements to be met and reduce the replacement cost associated with malfunctioned output transistors due to actuator shorts. Output FETs 388 thru 391, are shown in a typical H configuration, supplying drive current to the solar collector's actuator motor 366. In an alternative embodiment, FETs 388 thru 391 could be internalized into the SoC implementation reducing the interface electronics and simplifying the interface to the actuator motor 366.

Alternative Shadow Tolerance Embodiments

Electrical Shadow Tolerance Embodiments

Shadow tolerance can be implemented by various methods, each of which avoids providing highly non-uniform illumination to an active photovoltaic (or other conversion) cell. Predictable, progressive shadowing along an expected path is not uncommon. One method for providing shadow tolerance in the presence of predictable, progressive shadowing is to include dividing the target into regions parallel to expected shadowing. The target regions may ordinarily be attached to each other via electronically controlled switches, such as FETs.

When shading is known or expected, that portion of the target that is subject to shading may be separated from the active photovoltaic cell by readily designed electronics. Thereby, the effects of shadowing may be limited to a portion of the overall target conversion device. A conventional (typically Fresnel) lens may be used, as described with respect to FIG. 7, which shows a maximally shaded lens and target. The shadowed region 126 of the target may be divided into segments parallel to the shadow line. Four such sections are established, for example, each electrically separable from each other with FETs.

Those segments that are partly shadowed will begin to perform less well. Sensing the impairment, the FETs connecting an affected section to the whole may be switched off by any appropriate control, for example by means of an op amp sensing a reversal of current flow to the affected segment. The partly shaded region is thus isolated from the rest of the target device so as not to impair its efficiency. This has some advantages for cells that are more efficient with highly concentrated light, because the segments that remain active receive somewhat more concentrated light. Lens design and fabrication is simplified.

Figure 19:
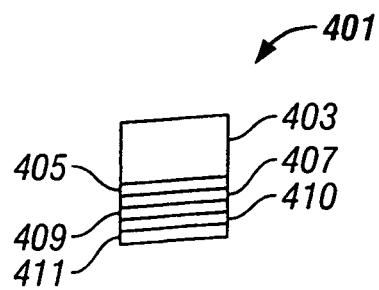
FIG. 19 shows the photovoltaic cell divided to provide shadow tolerance.

FIG. 19 shows a photovoltaic cell 401 divided into six regions. The upper portion of the photovoltaic cell 403 is a single integral cell, which receives light from the upper half of a conventional lens, which is not expected to be shaded in typical application. The lower area of the cell is divided into five long narrow strip cells 405, 407, 409, 410 and 411, the longer axis of each being parallel to the expected shadow line. Whether wired in parallel or series, any appropriate method may be employed to isolate each strip cell from the operating portion of the overall cell 401 when it is partly shadowed.

One wiring approach would be to connect each strip cell to a power bus through low voltage drop diodes such that, when properly illuminated, power that is generated by the strip cell reaches a power collection bus through the diode. When the strip cell is shaded, however, the diode keeps the power on the power bus from entering the shaded strip cell and consuming power. The low voltage drop diode may be replaced by an active ideal diode consisting of a low voltage op-amp controlling a field effect transistor FET, the devices configured to operate as a nearly ideal diode, reducing power loss associated with a diode voltage drop.

Similar approaches may be used after connecting corresponding segments of a number of photovoltaic devices. Thus, the photovoltaic device shown in FIG. 19 may be repeated at intervals along an expected shadow line, as would occur in a pontoon solar collector system. All segments of all photovoltaics in the pontoon corresponding to segment 411 may be connected in series. Similarly, all segments corresponding to segment 410 may be series connected, and so on. Each set of segments that is thus connected in series with each other may be treated as a single segment, for switching purposes, thereby reducing the number of switches and op amps that is required, and increasing the voltage levels so that sensing is simplified. As output falls below a certain level, the series connected segment may be disconnected so as not to absorb power.

Moreover, higher voltages in the series-connected format permit the use of simple flyback boost techniques to be used to obtain partial power from series segments whose power output has dropped off, but not declined to zero. A series diode (or equivalent) and flyback secondary winding may remain passive during normal operation. Upon the output dropping below a desired level, charge from the segment string may be diverted to a flyback transformer primary winding and then released, such that the power is transferred to the flyback secondary that is in series with the segment string. In this manner, or otherwise, extra voltage may be provided as necessary to bring the series segment output to a voltage at which it can contribute power to the grid. These techniques are well known in power supply technologies, and new techniques may also be developed. Accordingly, specific techniques are not illustrated in detail herein.

Secondary Optics

Figure 20:
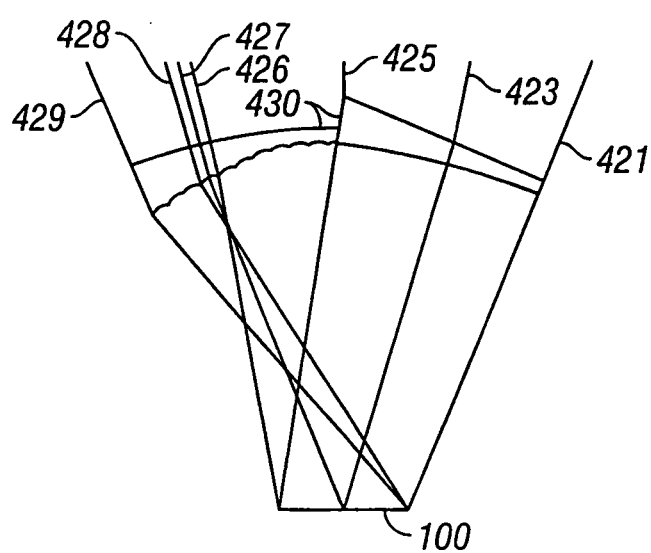
FIG. 20 is a cross sectional view of light transmission through secondary optics to a photovoltaic cell.

FIG. 20 shows one embodiment of secondary optics that may be used to facilitate shadow tolerance in a solar collector. Using a conventional point source Fresnel lens (such as illustrated in FIG. 7), incoming light rays 421, 423 and 425 would only illuminate the right half of the photovoltaic target shown in FIG. 20. A secondary optic 430 having an index of refraction greater than one may be added to the light path between the Fresnel lens and the target photovoltaic cell. The shape of the right half of the secondary optic 430 allows the light between light rays 421 and 425 to hit the entire photovoltaic cell uniformly. This region of light corresponds to the portion of the Fresnel lens that does not experience shade during normal operation. The light rays between 425 and 429 are refracted by the left half of the secondary optic 430 toward the photovoltaic target. The left half to the secondary optic is divided into facets. Each facet is shaped to deliver the light passing through the facet to the photovoltaic cell uniformly. Light rays 426 through 428 pass through one facet of the secondary optics before arriving at the photovoltaic cell 100. The light passing through the left half of the secondary optic represents the region of the Fresnel lens that will be variably shaded during normal operation. If three facets are shaded the remaining seven facets deliver homogeneous light to the photovoltaic cell 100.

The overall effect of the secondary optics is to provide shade tolerance by minimizing the amount of illumination variation of the photovoltaic cell due to variable shading of a primary, conventional lens. Increasing the number of facets will decrease the variation in photovoltaic illumination. A difference between secondary and primary optics, in this context, is that primary optics are farther from the target than are secondary optics. Also, primary optics used with two-axis tracking systems are designed to accept light from primarily a single direction or "incoming light axis." Secondary optics, on the other hand, receive light at a variety of angles as a result of refraction by the primary optics.

Subdivided Subregions

Another alternative embodiment of a shadow tolerant lens involves a thin horizontal strip of the roof lens surface including a multitude of individual regions, which may be called "subsubregions." Each subsubregion is a small refractive surface, capable of delivering the light that passes through the region to the target, but is not intended to deliver light uniformly over an entire surface of the target. Instead, the summation of light from a particular group of subsubregions will deliver light uniformly to the target. Such a particular group of subsubregions constitutes a subregion of the overall lens, and thus each subregion delivers light uniformly to the target.

Figure 21:
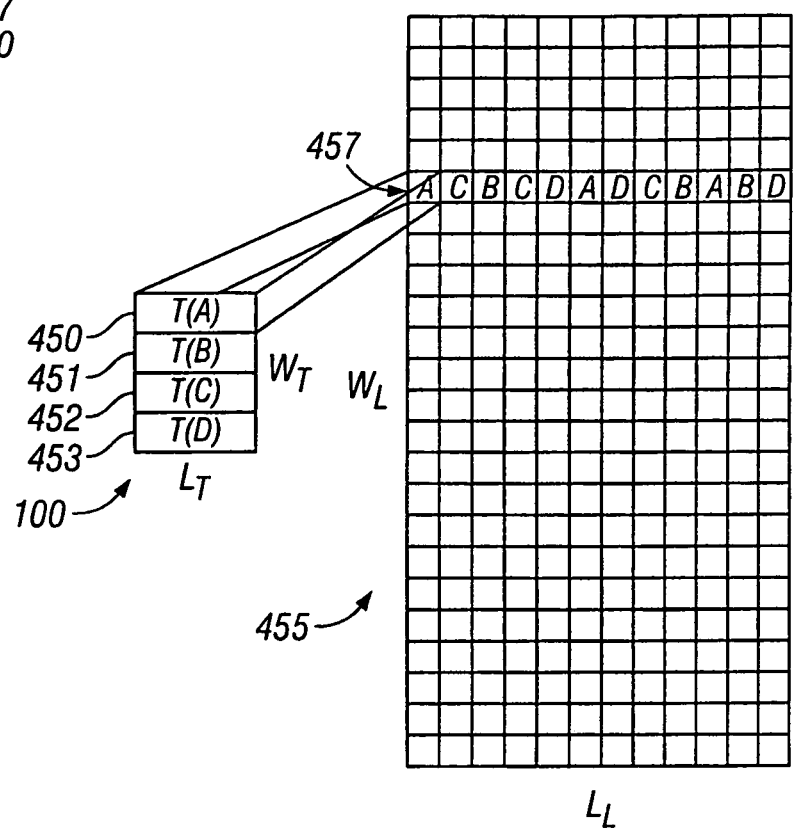
FIG. 21 shows a subsectioned target and a lens having subregions comprised of discontiguous sub subregions.

Referring to FIG. 21, a roof lens having a length $L_L$ (typically parallel to the rotation axis of a pontoon solar collector) and a width $W_L$. Each subsubregion in a strip 457 of subsubregions is identified as either A, B, C or D, and directs incident light toward a portion of a target 100. In particular, A subsubregions direct incident light toward a T(A) subsection 450 of the target 100. Similarly, B subsections direct incident light toward a T(B) subsection of the target 100, and so on.

An A subsubregion, a B subsubregion, and C subsubregion and a D subsubregion are all required to constitute a subregion that illuminates the target 100 uniformly. Note that, as illustrated, the four closest A, B, C and D subsubregions are not contiguous. Thus, there is no need for subregions to be contiguous, as is the case with tiles (although tiles are also subregions, of course). Indeed, the pattern of subsubregions may be, or appear to be, substantially random, so long as groups of subsubregions constitute subregions that distribute light to the target uniformly.

Note also that square subsubregions map to rectangular target subregions, illustrating that tiles, subregions, or subsubregions need not have the same aspect ratio of length to width as the target (or subtarget) to which they direct light. Forming the above stated regions with either a slight concave shape or a slight convex shape would allow each region in the thin horizontal strip to deliver its light uniformly to the entire target, further increasing the shadow tolerance of the lens.

Secondary Reflection

Figure 22:
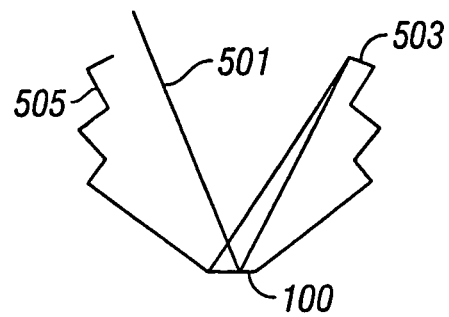
FIG. 22 is a cross sectional view of light paths to a target photovoltaic cell using a secondary reflector.

FIG. 22 illustrates secondary reflection in combination with a point focus or line focus roof lens to enhance efficiency. When a ray of light 501 strikes the photovoltaic cell 100, sometimes it will reflect off the surface of the cell 100. To increase the chances of using this reflected sunlight, a secondary reflector 503 may be placed around the cell to redirect the reflected sunlight back onto the cell 100. The inner surfaces of the secondary reflectors 503 and 505 are preferably highly reflective so as to efficiently direct the stray light reflecting off the cell back towards the cell's surface. Secondary reflectors 503 and 505 are designed to avoid the incoming light from the roof lens. For a point focus application, the secondary reflector may be rotated around an axis perpendicular to the center of the photovoltaic cell 100. In a line focus application the secondary reflector may be extruded in a direction normal to the drawing page. The structure of the secondary reflector may also be used to position secondary optics.

The foregoing description includes representative embodiments and some variations. It is impractical to disclose and discuss all useful variations, but the intent of providing a representative selection of variations is to illustrate that the invention is broadly understood by the inventor. Accordingly, the invention is defined only by the claims, which follow, plus any others, which may subsequently be drawn, and is not to be limited by any details of the disclosed embodiments, except insofar as they are claimed. All embodiments described by elements that fall with the range of equivalency of elements of the below claims are considered by the inventor to fall within the scope of the claimed invention.

What is claimed is:

1. A solar converter apparatus for converting incoming light to electricity, comprising:
   a) a support structure for floating on a liquid bath, the structure having:
      i) a substantially fixed relationship to an incoming light axis that is parallel to useful incoming light,
      ii) an elevation rotation axis at a fixed azimuth alignment angle from the incoming light axis, the support structure being rotatable about the elevation rotation axis, and
      iii) guidance interface features connecting the support structure to a guidance frame that aligns the elevation rotation axis at the fixed azimuth alignment angle to an azimuth of the source of incoming light, and that provide a rotation reference for the support structure rotation about the elevation rotation axis to align the incoming light axis with the source of incoming light;
   b) at least one photovoltaic conversion device mounted within the support structure and adapted for converting concentrated sunlight into electricity; and
   c) a lens coupled to the support structure for guiding light that is parallel to the incoming light axis and is received over a receiving region toward a conversion device that is mounted within the support structure, the conversion device having an active area that is smaller than an area of the receiving region;
   wherein the liquid bath is a coolant that provides primary cooling of the conversion device through thermal contact with an exterior of the support structure.

2. The apparatus of claim 1, wherein the photovoltaic mounting is on an inside of an exterior wall that in operation is in contact with the liquid bath at a point directly transverse the wall from a point of the mounting.

3. The apparatus of claim 1, wherein the support structure is a first support structure, and is disposed in contact with a liquid bath in an array of support structures, substantially abutting adjacent support structures that each have an elevation rotation axis parallel to and in a plane with the elevation rotation axis of the first support structure.

4. The apparatus of claim 1, wherein light parallel to the incoming light axis that enters with uniform density across an entire surface of the lens exits the lens at angles with respect to the incoming light axis, an average of all such exiting light angles defining a light delivery axis, the light delivery axis having a significant non-zero angle with respect to the incoming light axis.

5. The apparatus of claim 1, wherein the receiving region of the lens is subject to shadowing that causes substantially non-uniform illumination of the receiving region of the lens, the apparatus further comprising a shadow toleration mechanism that coordinates light entering through the lens with each target photovoltaic conversion device to avoid substantially non-uniform illumination of operating photovoltaic conversion devices due to such shadowing.

6. The apparatus of claim 1, further comprising a plurality of subregions of the lens that each receive light substantially parallel to the incoming light axis over a corresponding receiving subregion, wherein each subregion is configured to disperse the received light substantially uniformly over an entire surface of at least one corresponding target photovoltaic conversion device.

7. The apparatus of claim 1, wherein during operation the incoming light axis is aligned with a light source elevation angle, and the support structure floats in a coolant bath that has an average surface plane, the apparatus further comprising a device mounting site within the support structure, upon which a photovoltaic converter device is mounted, which during operation is below the coolant bath average surface plane for all light source elevation angles within 45 degrees from vertical.

8. A method of collecting incoming light for conversion to electricity, comprising:
   a) mounting a conversion device at a mounting site within a support structure having an elevation rotation axis;
   b) coupling a lens to the support structure to concentrate and guide incident light arriving parallel to an incoming light axis toward the conversion device;
   c) floating the support structure on a liquid bath;
   d) aligning the support structure so that the elevation rotation axis is at an azimuth alignment angle with respect to a source of light energy;

e) rotating the support structure about the elevation rotation axis to align the incoming light axis toward the source of light energy; and f) cooling the conversion device primarily through thermal contact between the liquid bath and an exterior of the support structure.

9. The method of claim 8, further comprising cooling the conversion device primarily through thermal contact between the liquid bath and an exterior of a wall of the support structure, the wall having an interior upon which the conversion device is mounted opposite an expected area of contact with the liquid bath, such that in operation at least one line perpendicular to the wall traverses the conversion device mounting on an immediate inside of the wall and the liquid bath on an immediate outside of the wall.

10. The method of claim 8, wherein the support structure, lens and conversion device are part of a first collection pontoon, further comprising substantially abutting the first collection pontoon in an array with adjacent collection pontoons that each have an elevation rotation axis parallel to and in a plane with the elevation rotation axis of the support structure of the first collection pontoon.

11. The method of claim 8, wherein a light delivery axis is defined as a line that intersects the incoming light axis at a center of the lens and has an angle with respect to the incoming light axis that is equal to an average angle of light exiting the lens when such light entered the lens parallel to the incoming light axis and uniformly distributed over an entire surface of the lens, the method further comprising configuring the lens to have the light delivery axis at a significantly non-zero angle with respect to the incoming light axis.

12. The method of claim 8, wherein the lens has a light receiving region, further comprising incorporating into the receiving region a multiplicity of receiving subregions that each receive light arriving parallel to the incoming light axis, and that each disperse such received light substantially uniformly over an entire surface of a target conversion device.

13. The method of claim 8 wherein the liquid bath is a coolant bath having an average surface plane, the method further comprising positioning the conversion device mounting site below the coolant bath average surface plane for all light source elevation angles within 45 degrees from vertical.

14. The method of claim 8, further comprising incorporating a light source direction sensor within each pontoon.

\* \* \* \* \*